United States Patent [19]

Kajimoto

[11] Patent Number: 5,381,367
[45] Date of Patent: Jan. 10, 1995

[54] SEMICONDUCTOR MEMORY DEVICE AND AN OPERATING METHOD OF THE SAME

[75] Inventor: Takeshi Kajimoto, Hyogo, Japan

[73] Assignee: Mitsubishi Denki Kabushiki Kaisha, Tokyo, Japan

[21] Appl. No.: 36,571

[22] Filed: Mar. 24, 1993

[30] Foreign Application Priority Data

Jul. 21, 1992 [JP] Japan .................................. 4-194097

[51] Int. Cl.$^6$ ............................ G11C 7/00; G11C 8/00
[52] U.S. Cl. ........................ 365/189.01; 365/189.03; 365/221; 365/230.01; 365/230.04; 365/230.09; 365/239
[58] Field of Search ................. 365/189.01, 220, 221, 365/230.01, 230.05, 230.04, 230.09, 239, 189.03, 189.04

[56] References Cited

U.S. PATENT DOCUMENTS

| | | | |
|---|---|---|---|
| 5,150,327 | 9/1992 | Matsushima et al. | 365/189.01 |
| 5,229,971 | 7/1993 | Kiryu et al. | 365/189.01 |
| 5,299,161 | 3/1994 | Choi et al. | 365/201 |
| 5,313,423 | 5/1994 | Sato et al. | 365/200 |

OTHER PUBLICATIONS

Masao Taguchi et al, A 40ns 64Mb DRAM with Current-Sensing Data-Bus Amplifier, IEEE International Solid-State Circuits Conference, 1991, pp. 112-113.

Primary Examiner—Eugene R. LaRoche
Assistant Examiner—Huan Hoang
Attorney, Agent, or Firm—Lowe, Price, LeBlanc & Becker

[57] ABSTRACT

First and second input/output line groups are provided. A plurality of first bit line groups are connected to the first input/output line group through corresponding column selecting circuits, respectively. A plurality of second bit line groups are connected to the second input/output line group through corresponding column selecting circuits, respectively. A column decoder activates one of the column selecting circuits corresponding to the first bit line group and one of the column selecting circuits corresponding to the second bit line group at the same time or with a predetermined time difference.

18 Claims, 27 Drawing Sheets

FIG. 4

(SERIAL MODE)

| START ADDRESS | COLUMN SELECTING CIRCUIT ACTIVATED AT FIRST | ACCESSABLE RANGE WITHOUT ACTIVATING NEW COLUMN SELECTING CIRCUIT |
|---|---|---|
| Y1 | SL1,SL2 | Y1,Y2,Y3,Y4,Y5,Y6,Y7,Y8 |
| Y2 | SL1,SL2 | Y2,Y3,Y4,Y5,Y6,Y7,Y8 |
| Y3 | SL1,SL2 | Y3,Y4,Y5,Y6,Y7,Y8 |
| Y4 | SL1,SL2 | Y4,Y5,Y6,Y7,Y8 |
| Y5 | SL2,SL3 | Y5,Y6,Y7,Y8,Y9,Y10,Y11,Y12 |
| Y6 | SL2,SL3 | Y6,Y7,Y8,Y9,Y10,Y11,Y12 |
| Y7 | SL2,SL3 | Y7,Y8,Y9,Y10,Y11,Y12 |
| Y8 | SL2,SL3 | Y8,Y9,Y10,Y11,Y12 |
| Y9 | SL3,SL4 | Y9,Y10,Y11,Y12,Y13,Y14,Y15,Y16 |
| Y10 | SL3,SL4 | Y10,Y11,Y12,Y13,Y14,Y15,Y16 |
| Y11 | SL3,SL4 | Y11,Y12,Y13,Y14,Y15,Y16 |
| Y12 | SL3,SL4 | Y12,Y13,Y14,Y15,Y16 |
| ⋮ | ⋮ | ⋮ |

FIG. 5

(ADDRESS LAPPING MODE)

| START ADDRESS | COLUMN SELECTING CIRCUIT ACTIVATED AT FIRST | ACCESSABLE RANGE WITHOUT ACTIVATING NEW COLUMN SELECTING CIRCUIT |
|---|---|---|
| Y1 | SL1,SL2 | Y1,Y2,Y3,Y4,Y5,Y6,Y7,Y8 |
| Y2 | SL1,SL2 | Y2,Y3,Y4,Y5,Y6,Y7,Y8,Y1 |
| Y3 | SL1,SL2 | Y3,Y4,Y5,Y6,Y7,Y8,Y1,Y2 |
| Y4 | SL1,SL2 | Y4,Y5,Y6,Y7,Y8,Y1,Y2,Y3 |
| Y5 | SL1,SL2 | Y5,Y6,Y7,Y8,Y1,Y2,Y3,Y4 |
| Y6 | SL1,SL2 | Y6,Y7,Y8,Y1,Y2,Y3,Y4,Y5 |
| ⋮ | ⋮ | ⋮ |

| (a) (IN SERIAL MODE) | | | | | (b) (IN LAPPING MODE) | | | | |
|---|---|---|---|---|---|---|---|---|---|
| A4 | A3 | A2 | A1 | A0 | A4 | A3 | A2 | A1 | A0 |
| 0 | 0 | 1 | 0 | 1 | 0 | 0 | 1 | 0 | 1 |
| 0 | 0 | 1 | 1 | 0 | 0 | 0 | 1 | 1 | 0 |
| 0 | 0 | 1 | 1 | 1 | 0 | 0 | 1 | 1 | 1 |
| 0 | 1 | 0 | 0 | 0 | 0 | 0 | 0 | 0 | 0 |
| 0 | 1 | 0 | 0 | 1 | 0 | 0 | 0 | 0 | 1 |
| 0 | 1 | 0 | 1 | 0 | 0 | 0 | 0 | 1 | 0 |
| 0 | 1 | 0 | 1 | 1 | 0 | 0 | 0 | 1 | 1 |
| 0 | 1 | 1 | 0 | 0 | 0 | 0 | 1 | 0 | 0 |

TRUTH TABLE OF A CONVENTIONAL PRE DECODER (a)

| A3 | A2 | P4 | P3 | P2 | P1 |
|----|----|----|----|----|----|
| 0  | 0  | 0  | 0  | 0  | 1  |
| 0  | 1  | 0  | 0  | 1  | 0  |
| 1  | 0  | 0  | 1  | 0  | 0  |
| 1  | 1  | 1  | 0  | 0  | 0  |

TRUTH TABLE OF THE PRE DECODER OF ONE EMBODIMENT (IN SERIAL MODE)

(b)

| A3 | A2 | P4 | P3 | P2 | P1 |
|----|----|----|----|----|----|
| 0  | 0  | 0  | 0  | 1  | 1  |
| 0  | 1  | 0  | 1  | 1  | 0  |
| 1  | 0  | 1  | 1  | 0  | 0  |
| 1  | 1  | 1  | 0  | 0  | 1  |

(IN ADDRESS LAPPING MODE)

(c)

| A3 | A2 | P4 | P3 | P2 | P1 |
|----|----|----|----|----|----|
| 0  | 0  | 0  | 0  | 1  | 1  |
| 0  | 1  | 0  | 0  | 1  | 1  |
| 1  | 0  | 1  | 1  | 0  | 0  |
| 1  | 1  | 1  | 1  | 0  | 0  |

FIG. 13

TRUTH TABLE OF ADDRESS CONVERSION LOGIC CIRCUIT

| A2 | A1 | A0 | S4 | S8 | S3 | S7 | S2 | S6 | S1 | S5 |
|----|----|----|----|----|----|----|----|----|----|----|
| 0 | 0 | 0 | 0 | 1 | 0 | 0 | 1 | 0 | 1 | 0 |
| 0 | 0 | 1 | 0 | 0 | 1 | 0 | 1 | 0 | 1 | 0 |
| 0 | 1 | 0 | 1 | 0 | 1 | 0 | 1 | 0 | 0 | 0 |
| 0 | 1 | 1 | 1 | 0 | 1 | 0 | 0 | 0 | 0 | 1 |
| 1 | 0 | 0 | 1 | 0 | 0 | 0 | 0 | 1 | 0 | 1 |
| 1 | 0 | 1 | 0 | 0 | 0 | 1 | 0 | 1 | 0 | 1 |
| 1 | 1 | 0 | 0 | 1 | 0 | 1 | 0 | 1 | 0 | 0 |
| 1 | 1 | 1 | 0 | 1 | 0 | 1 | 0 | 0 | 1 | 0 |

FIG. 18

(SERIAL MODE)

| START ADDRESS | ACTIVATED COLUMN SELECTING CIRCUITS (ACCESSED RANGE) |
|---|---|
| Y1 | SL1a(Y1,Y2,Y3,Y4) → SL2a(Y5,Y6,Y7,Y8) |
| Y2 | SL1a(Y2,Y3,Y4) → SL2b(Y5,Y6,Y7,Y8) → SL3b(Y9) |
| Y3 | SL1a(Y3,Y4) → SL2a(Y5,Y6,Y7,Y8) → SL3a(Y9,Y10) |
| Y4 | SL1a(Y4) → SL2b(Y5,Y6,Y7,Y8) → SL3b(Y9,Y10,Y11) |
| Y5 | SL2a(Y5,Y6,Y7,Y8) → SL3a(Y9,Y10,Y11,Y12) |
| Y6 | SL2a(Y6,Y7,Y8) → SL3b(Y9,Y10,Y11,Y12) → SL4b(Y13) |
| Y7 | SL2a(Y7,Y8) → SL3a(Y9,Y10,Y11,Y12) → SL4a(Y13,Y14) |
| Y8 | SL2a(Y8) → SL3b(Y9,Y10,Y11,Y12) → SL4b(Y13,Y14,Y15) |

F I G. 1 9

(ADDRESS LAPPING MODE)

| START ADDRESS | ACTIVATED COLUMN SELECTING CIRCUITS (ACCESSED RANGE) |
|---|---|
| Y1 | SL1a(Y1,Y2,Y3,Y4) → SL2a(Y5,Y6,Y7,Y8) |
| Y2 | SL1a(Y2,Y3,Y4) → SL2b(Y5,Y6,Y7,Y8) → SL1b(Y1) |
| Y3 | SL1a(Y3,Y4) → SL2a(Y5,Y6,Y7,Y8) → SL1a(Y1,Y2) |
| Y4 | SL1a(Y4) → SL2b(Y5,Y6,Y7,Y8) → SL1b(Y1,Y2,Y3) |
| Y5 | SL2a(Y5,Y6,Y7,Y8) → SL1a(Y1,Y2,Y3,Y4) |
| Y6 | SL2a(Y6,Y7,Y8) → SL1b(Y1,Y2,Y3,Y4) → SL2b(Y5) |
| Y7 | SL2a(Y7,Y8) → SL1a(Y1,Y2,Y3,Y4) → SL2a(Y5,Y6) |
| Y8 | SL2a(Y8) → SL1b(Y1,Y2,Y3,Y4) → SL2b(Y5,Y6,Y7) |

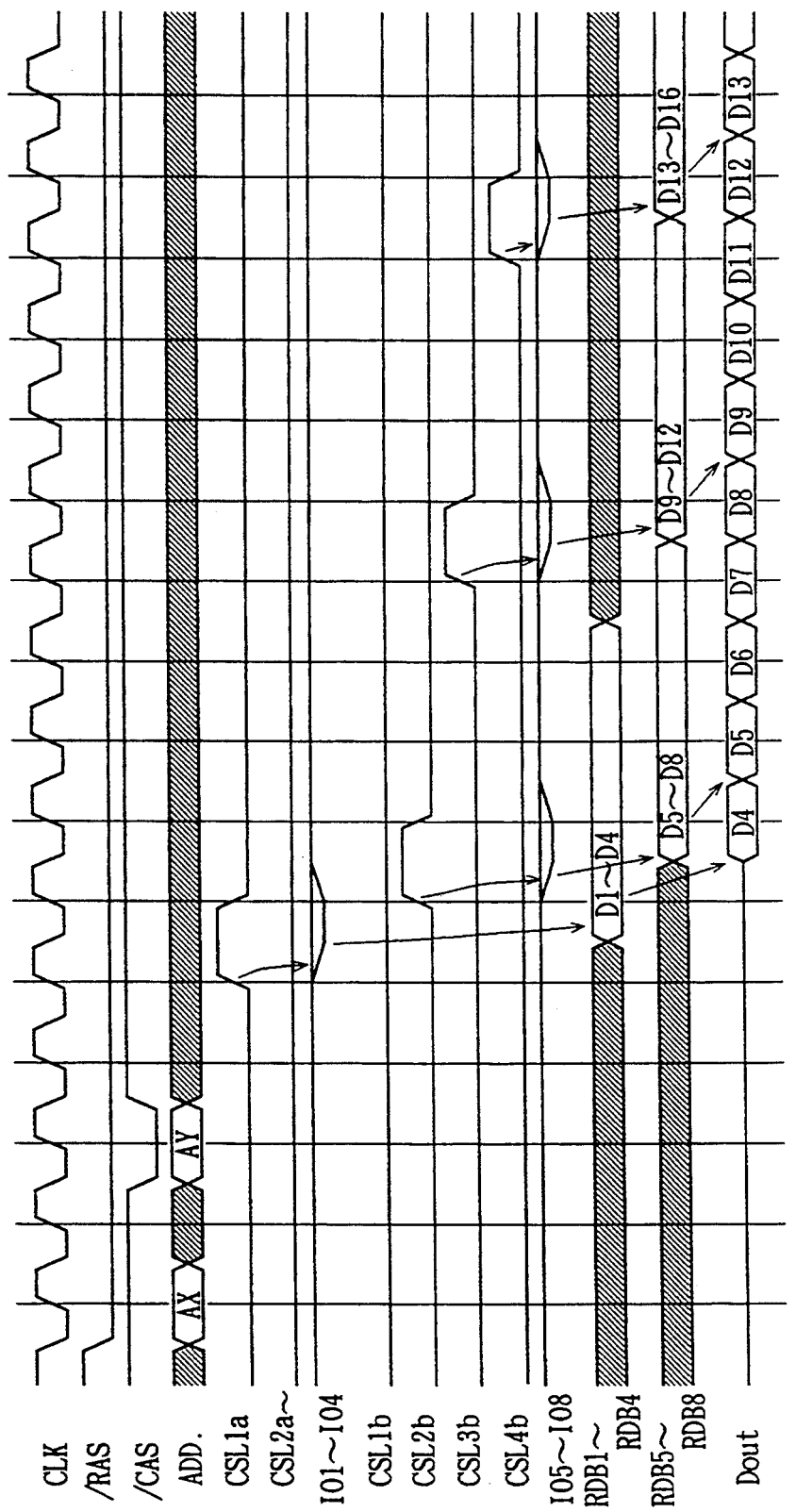

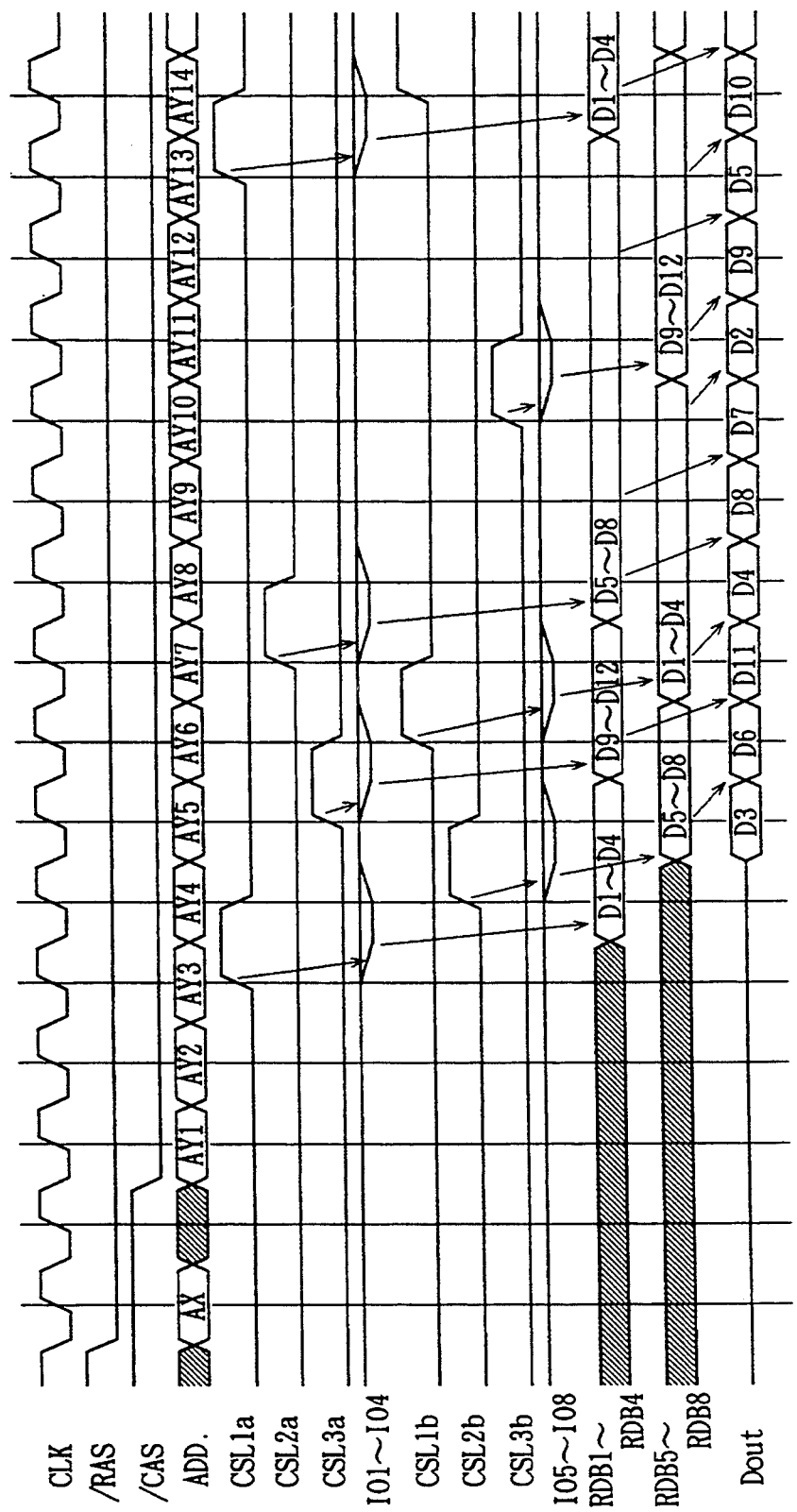

F I G. 2 7   PRIOR ART

| START ADDRESS | COLUMN SELECTING CIRCUIT ACTIVATED AT FIRST | ACCESSABLE RANGE WITHOUT ACTIVATING NEW COLUMN SELECTING CIRCUIT |
|---|---|---|
| Y1 | SL1 | Y1,Y2,Y3,Y4 |
| Y2 | SL1 | Y2,Y3,Y4 |
| Y3 | SL1 | Y3,Y4 |
| Y4 | SL1 | Y4 |
| Y5 | SL2 | Y5,Y6,Y7,Y8 |
| Y6 | SL2 | Y6,Y7,Y8 |
| Y7 | SL2 | Y7,Y8 |
| Y8 | SL2 | Y8 |
| Y9 | SL3 | Y9,Y10,Y11,Y12 |
| Y10 | SL3 | Y10,Y11,Y12 |
| Y11 | SL3 | Y11,Y12 |
| ⋮ | ⋮ | ⋮ |

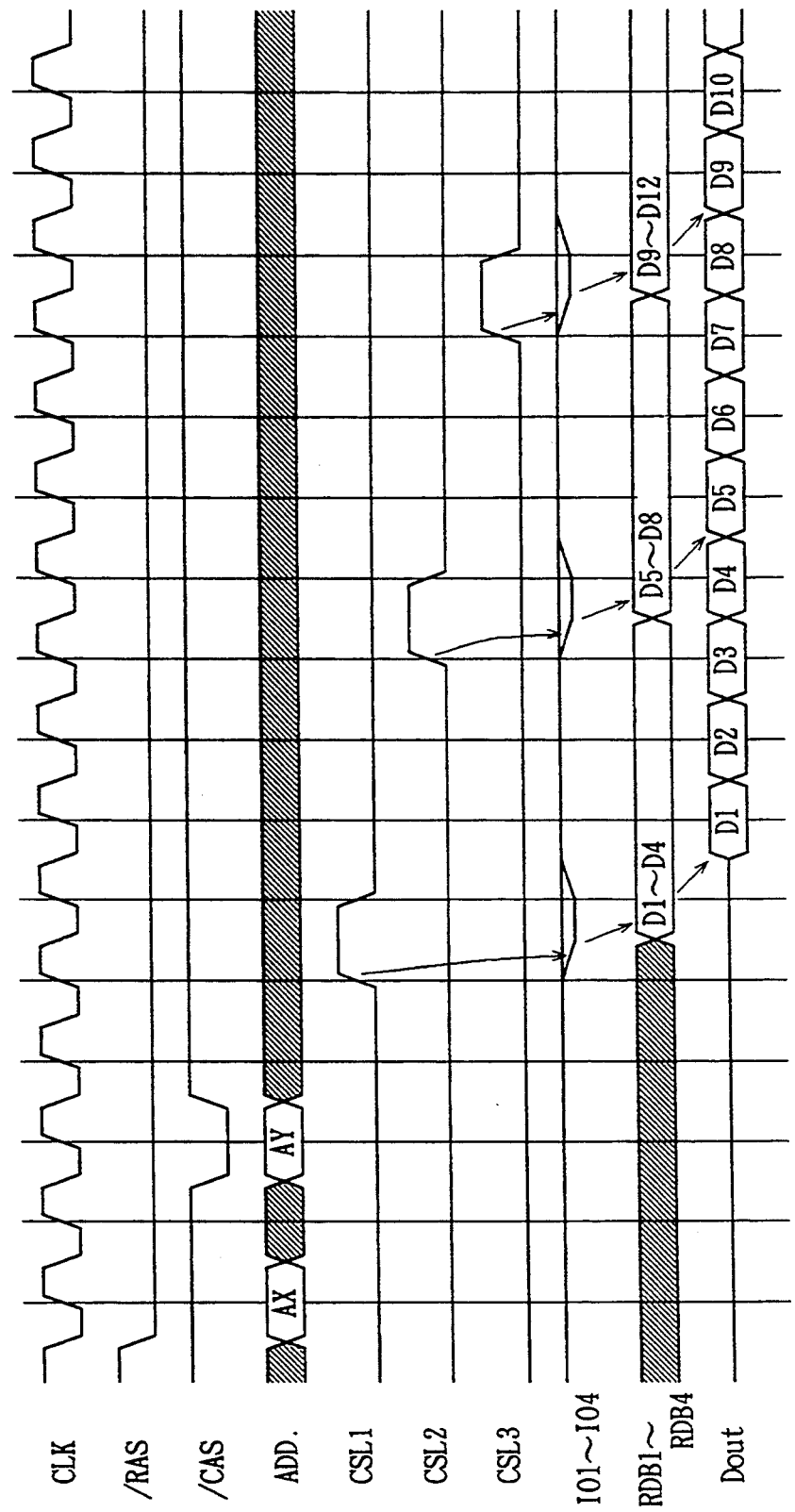

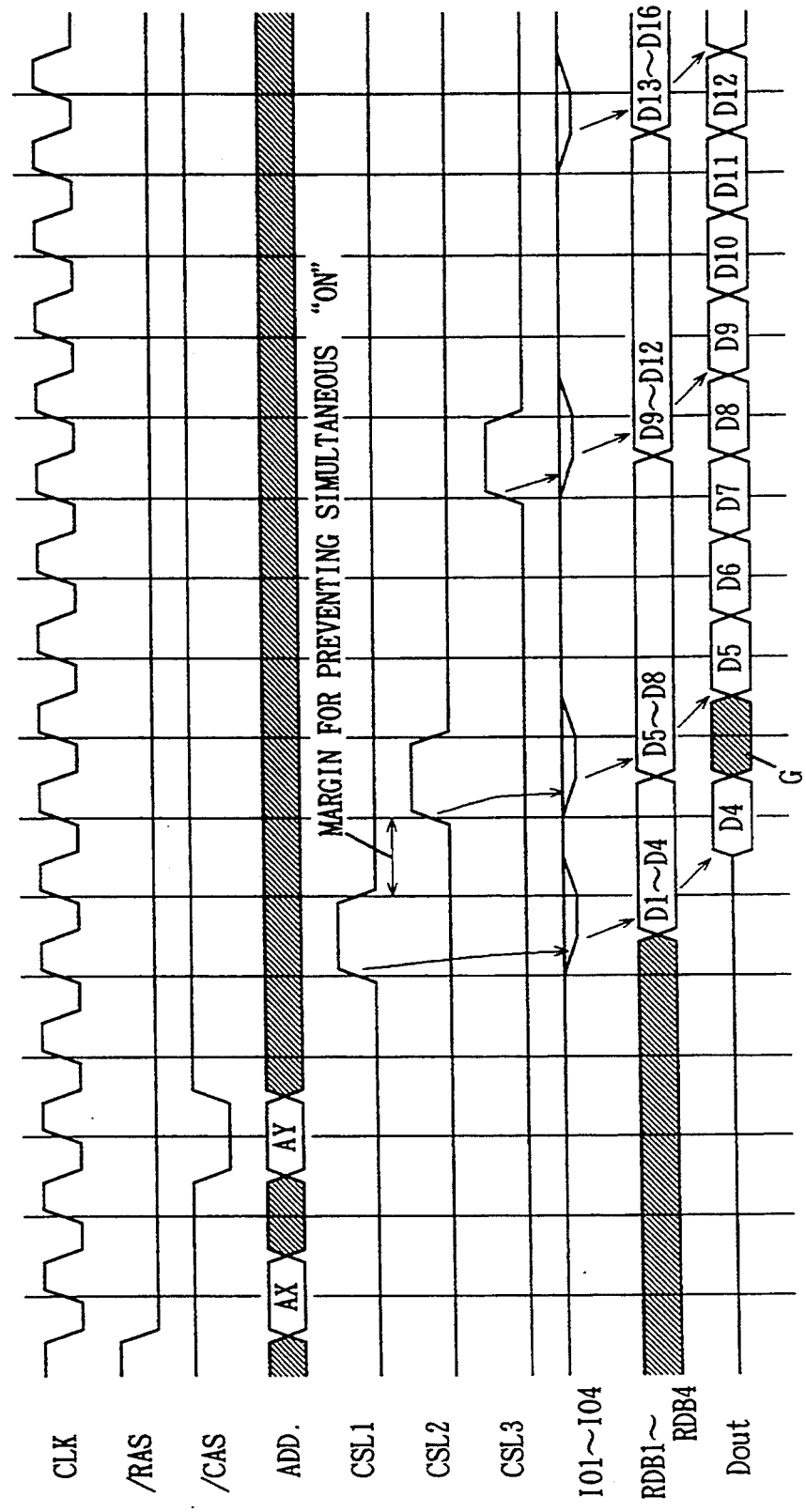

SEMICONDUCTOR MEMORY DEVICE AND AN OPERATING METHOD OF THE SAME

BACKGROUND OF THE INVENTION

1. Field of the Invention

The present invention relates to a semiconductor memory device, and in particular, to an improvement of a column selecting system.

2. Description of the Background Art

FIG. 24 is a block diagram showing an example of a dynamic random access memory will be referred to as "DRAM" hereinafter) in the prior art. FIG. 25 specifically shows a structure of a major part of the DRAM shown in FIG. 24.

Four memory blocks are provided on a semiconductor chip CH. However, FIG. 24 shows only one memory block B1 among them.

A memory array 1 includes a plurality of bit line pairs, a plurality of word lines crossing the bit line pairs, and a plurality of memory cells disposed at crossings of the bit line pairs and the word lines. In FIG. 25, there are shown bit line pairs BL1–BL8, a plurality of word lines WL crossing the bit line pairs BL1–BL8, and a plurality of memory cells MC disposed at the crossings of the bit line pairs BL1–BL8 and word lines WL. The bit line pairs are divided into a plurality of bit line groups BG1 and BG2, each of which includes four bit line pairs. In FIG. 25, the bit line pairs BL1–BL4 form the bit line group BG1, and the bit line pairs BL5–BL8 form the bit line group BG2.

The word lines WL are connected to a row decoder 2 shown in FIG. 24. The row decoder 2 selects any one of the word lines WL to activate the selected word line WL. The row decoder 2 sets the potential of the selected word line at a high level, and sets the potential of the unselected word lines at a low level.

A sense amplifier group 3 shown in FIG. 24 includes a plurality of sense amplifiers SA (FIG. 25) which are connected to the bit line pairs, respectively. Each sense amplifier SA senses and amplifies a potential difference on the corresponding bit line pair.

A column selecting circuit group 4 shown in FIG. 24 includes a plurality of column selecting circuits which are provided corresponding to the bit line groups, respectively. In FIG. 25, there are shown a column selecting circuit SL1 provided corresponding to the bit line group BG1, and a column selecting circuit SL2 provided corresponding to the bit line group BG2.

Each column selecting circuit includes four sets of transfer gates TG which correspond to the four bit line pairs in each bit line group, respectively. The four bit line pairs in each bit line group are connected through four sets of the transfer gates TG to four input/output line pairs IO1–IO4, respectively.

A column decoder 5 selects any one of the bit line groups, and renders four sets of the transfer gates TG in the corresponding column selecting circuit conductive simultaneously. In FIG. 25, the column decoder 5 generates a column selecting signal CSL1, which is applied to four sets of the transfer gates TG in the column selecting circuit SL1, and also generates a column selecting signal CSL2, which is applied to four sets of the transfer gates TG in the column selecting circuit SL2.

In FIG. 24, the memory block B1 further includes an input buffer 6, a 4-bit serial/parallel converter circuit 7, a write buffer 8, a preamplifier 9, a 4-bit parallel/serial converter circuit 10 and an output buffer 11. The input buffer 6, serial/parallel converter circuit 7 and write buffer 8 operate in a data write operation. The preamplifier 9, parallel/serial converter circuit 10 and output buffer 11 operate in a data read operation.

On the semiconductor chip CH, there are further provided a row address buffer 12, a column address buffer 13, a control signal buffer 14, a CLK buffer 15, an address counter 16 and a timing generator 17.

The row address buffer 12 applies an externally applied address signal ADD to the row decoder 2 as a row address signal at a predetermined timing. The column address buffer 13 applies an externally applied address signal ADD to the address counter 16 as a column address signal at a predetermined timing.

The control signal buffer 14 receives an external row address strobe signal /RAS, an external column address strobe signal /CAS, an external write enable signal /WE and an external output enable signal /OE, and applies the same to the timing generator 17. The CLK buffer 15 receives an externally applied clock signal CLK, and applies the same to respective circuits in the chip.

The address counter 16 receives the column address signal-applied from the column address buffer 13 as the start address, and sequentially changes the start address in response to the clock signal CLK. The address counter 16 generates the column address signal which includes two bits A0 and A1, which are applied to the serial/parallel converter circuit 7 and parallel/serial converter circuit 10. Other bits A2–An in this column address signal are applied to the column decoder 5. The timing generator 17 generates various control signals for controlling respective circuits in the chip.

An operation in a random access mode of the DRAM shown in FIGS. 24 and 25 will be described below.

The row decoder 2 selects one of the word lines WL in the memory array 1 in response to the row address signal, and raises its potential to high. Thereby, data are read from the memory cells MC connected to the selected word line WL onto the corresponding bit lines. The read data are sensed and amplified by sense amplifiers SA contained in the sense amplifier group 3, and are held therein.

Thereafter, the column decoder 5 selects one of the bit line groups to activate the corresponding column selecting circuit in response to the bits A2–An in the column address signal, which is applied thereto through the address counter 16. Thereby, the four bit line pairs in the selected bit line group are connected through the column selecting circuit to the four input/output line pairs IO1–IO4, respectively.

In data reading operation, four bits of data on the four bit line pairs in the selected bit line group are applied through the four input/output line pairs IO1–IO4 to the preamplifier 9 for amplification. The four bits of data amplified by the preamplifier 9 are applied to read data buses RDB1–RDB4, respectively. The parallel/serial converter circuit 10 is responsive to the two bits A0 and A1 in the column address signal to apply one of the four bits of data on the read data buses RDB1–RDB4 to the output buffer 11. Consequently, the data is supplied from the output buffer 11 to the input/output terminal I/O.

In data writing operation, the input/output terminal I/O sequentially receives external data. The data are sequentially applied through the input buffer 6 to the serial/parallel converter circuit 7. The serial/parallel converter circuit 7 converts the data into parallel data and applies the same to the write buffer 8. Thereby, the data is applied to each of the four input/output line pairs IO1-IO4. The four data on the input/output line pairs IO1-IO4 are applied through the activated column selecting circuit to the four bit line pairs in the selected bit line group, and are written into the four memory cells MC.

Meanwhile, after the activation of one word line WL, the data held by the sense amplifiers SA contained in the sense amplifier group 3 can be continuously read onto the input/output line pairs IO1-IO4 by sequentially activating the column selecting circuits.

A mode, in which the column selecting circuits are randomly activated in accordance with the externally applied address signals is referred to as a page mode. A mode, in which only the address signal designating the start address is set in the address counter 16, and thereafter, the column selecting circuits are sequentially activated by the address signals generated from the address counter 16, is referred to as a serial mode. Since the sense amplifier group 3 generally holds the data of thousands of bits, the page mode and serial mode enable access at a high speed.

Particularly, in the serial mode, a plurality of data, which are obtained by the activation of one column selecting circuit, may be subjected to the parallel/serial conversion, or a time sharing operation (pipeline control) may be carried out, whereby the speed of serial access is further increased.

FIG. 26 shows a major part of the DRAM shown in FIGS. 24 and 25. In FIG. 25, the bit line group BG1 includes the bit line pairs BL1-BL4, and the bit line group BG2 includes the bit line pairs BL5-BL8. A bit line group BG3 includes bit line pairs BL9-BL12, and a bit line group BG4 includes bit line pairs BL13-BL16.

The column addresses allocated to the bit line pairs BL1-BL16 are designated by Y1, Y2, ..., Y16, respectively.

The bit line pairs BL1-BL4 in the bit line group BG1 are connected through the column selecting circuit SL1 to the input/output line pairs IO1-IO4, respectively. The bit line pairs BL5-BL8 in the bit line group BG2 are connected through the column selecting circuit SL2 to the input/output line pairs IO1-IO4, respectively. The bit line pairs BL9-BL12 in the bit line group BG3 are connected through the column selecting circuit SL3 to the input/output line pairs IO1-IO4, respectively. The bit line pairs BL13-BL16 in the bit line group BG4 are connected through the column selecting circuit SL4 to the input/output line pairs IO1-IO4, respectively, As described above, the input/output line pairs IO1-IO4 are common to all the bit line groups. Therefore, simultaneous activation of the multiple column selecting circuits is impossible.

In the serial mode, the start address is set in the address counter 16, and one column selecting circuit corresponding to the start address is activated.

As shown in FIG. 27, if the start address is set at any of Y1-Y4, the column selecting circuit SL1 is first activated. If the start address is set at Y1, the column addresses Y1, Y2, Y3 and Y4 are sequentially accessed, upon activation of the column selecting circuit SL1. If the start address is set at Y2, the column addresses Y2, Y3 and Y4 and are sequentially accessed, upon activation of the column selecting circuit SL1. If the start address is set at Y3, the column addresses Y3 and Y4 are sequentially accessed, upon activation of the column selecting circuit SL1. If the start address is set at Y4, only the column address Y4 is accessed, upon activation of the column selecting circuit SL1.

As described above, the extent which can be accessed without requiring the activation of another column selecting circuit, depends on the start address. In particular, if the start address is set, for instance, at Y4, it is necessary to activate another column selecting circuit in order to access the next column address. This results in a problem that a time period from the activation of the column selecting circuit to the operation of the preamplifier determines the bit rate.

This problem will be described below with reference to waveform diagrams of FIGS. 28 and 29.

FIG. 28 is a timing chart showing an operation when the start address is set at Y1 in the serial mode. FIG. 29 is a timing chart showing an operation when the start address is set at Y4 in the serial mode.

In FIGS. 28 and 29, D1-D12 designate data read onto the bit line pairs BL1-BL12 (see FIGS. 25 and 26), respectively.

When the external row address strobe signal /RAS falls to low, an externally applied address signal ADD is applied to the row decoder 2 as a row address signal AX. Thereby, one of the word lines WL is activated. Thereafter, when the external column address strobe signal /CAS falls to low, an externally applied address signal ADD is applied to the address counter 16 as a column address signal AY. The address counter 16 applies the two bits A0 and A1 in the column address signal AY to the parallel/serial converter circuit 10, and applies the other bits A2-An to the column decoder 5.

As shown in FIG. 28, if the column address signal AY designates the column address Y1, the start address is set at Y1. First, the column decoder 5 raises the column selecting signal CSL1 to high and activates the column selecting circuit SL1. Thereby, the data D1-D4 on the bit line pairs BL1-BL4 are read onto the input/output line pairs IO1-IO4, respectively.

The data D1-D4 are applied through the preamplifier 9 to the read data buses RDB1-RDB4. The address counter 16 sequentially counts up the column address signal AY in response to the clock signal CLK applied from the CLK buffer 15. The parallel/serial converter circuit 10 sequentially selects the data D1-D4 and applies the same to the output buffer 11 in response to the two bits A0 and A1 in the column address signals AY. In this manner, the data D1-D4 are serially supplied from the input/output terminal I/O as output data Dout.

When the column decoder 5 raises the column selecting signal CSL2 to high, the data D5-D8 are read onto the input/output line pairs IO1-IO4 in a similar manner, respectively. The data D5-D8 are applied through the preamplifier 9 to the read data buses RDB1-RDB4, respectively. The address counter 16 sequentially counts up the column address signal AY in response to the clock signal CLK applied from the CLK buffer 15. The parallel/serial converter circuit 10 by sequentially selects the data D5-D8 and applies the same to the output buffer 11 in response to the two bits A0 and A1 in the column address signal AY. Thereby, the data D5-D8 are sent in serial from the input/output terminal I/O as the output data Dout.

In this manner, the data are read in serial from the input/output terminal I/O.

As shown in FIG. 29, if the column address signal AY designates the column address Y4, the start address is set at Y4. Also in this case, the column decoder 5 first raises the column selecting signal CSL1 to high and activates the column selecting circuit SL1. Thereby, the data D1–D4 on the bit Line pairs BL1–BL4 are read onto the input/output line pairs IO1–IO4, respectively.

The data D1–D4 are applied through the preamplifier 9 to the read data buses RDB1–RDB4, in response to the two bits A0 and A1 in the column address signal respectively. The parallel/serial converter circuit 10 selects the data D4 and applies the same to the output buffer 11 in response to the two bits A0 and A1 in the column address signal. Thereby, the data D4 is supplied from the input/output terminal I/O as the output data Dout.

When the column decoder 5 raises the column selecting signal CSL2 to high, the data D5–D8 are read onto the input/output line pairs IO1–IO4 in a similar manner, respectively. The data D5–D8 are applied through the preamplifier 9 to the read data buses RDB1–RDB4, respectively. The address counter 16 sequentially counts up the column address signal AY in response to the clock signal CLK applied from the CLK buffer 15. The parallel/serial converter circuit 10 sequentially selects the data D5–D8 to apply the same to the output buffer 11 in response to the two bits A0 and A1 in the column address signal AY. Thereby, the data D5–D8 are sent in serial from the input/output terminal I/O as the output data Dout.

In this case, the column selecting signal CSL2 can be raised to high only after the column selecting signal CSL1 falls to low. In order to prevent simultaneous change of two column selecting signals to the on-state, a margin is required between the fall of the column selecting signal CSL1 and the rise of the column selecting signal CSL2.

As shown in FIG. 28, if the column address signal AY designates the column address Y1, there is no gap between the output data, and thus the bit rate does not decrease. As shown in FIG. 29, however, if the column address signal AY designates the column address Y4, a gap is generated between the data D4 and D5 supplied from the input/output terminal I/O. Thus, there is a data gap when one bit line pair in a certain bit line group and one bit line pair in another bit line group are continuously selected. This causes reduction of the access speed and bit rate.

SUMMARY OF THE INVENTION

An object of the invention is to provide a semiconductor memory device allowing high-speed access.

Another object of the invention is to provide a semiconductor memory device allowing serial access at a high speed and at a high bit rate.

Still another object of the invention is to provide a semiconductor memory device allowing a high-speed serial mode without restriction of a start address.

A semiconductor memory device according to one aspect of the invention includes a memory array including a plurality of memory cells and a plurality of bit lines, n input/output line groups, a plurality of connecting circuits and a column selecting circuit.

The plurality of memory cells are disposed in a plurality of rows and a plurality of columns, and each store data. The plurality of bit lines are provided corresponding to the plurality of columns and each bit line is connected to memory cells of the corresponding column. The plurality of bit lines are divided into a plurality of bit line groups, each including a predetermined number of bit lines. The plurality of bit line groups are classified into n main groups.

The n input/output line groups are provided corresponding to the n main groups, respectively, and each input/output line group includes a predetermined number of input/output lines. The plurality of connecting circuits are provided corresponding to the plurality of bit line groups, respectively, and each connecting circuit is connected between the corresponding bit line group and the corresponding input/output line group. The column selecting circuit selectively generates a plurality of selecting signals, which correspond to the plurality of connecting circuits, respectively, for selecting any of the plurality of bit line groups.

Each of the plurality of connecting circuits is responsive to the corresponding selecting signal to be activated and connects the respective bit lines in the corresponding bit line group to the input/output lines in the corresponding input/output line group. The column selecting circuit includes a circuit which activates a plurality of connecting circuits connected to different input/output line groups in the memory array at the same time or with a predetermined time difference.

A semiconductor memory device according to another aspect of the invention includes a memory array including a plurality of memory cells and a plurality of bit lines, n input/output line groups, n connecting circuit groups, and a column selecting circuit.

The plurality of memory cells are disposed in a plurality of rows and a plurality of columns, and each store data. The plurality of bit lines are provided corresponding to the plurality of columns, and each bit line is connected to the memory cells in the corresponding column. The plurality of bit lines are divided into a plurality of bit line groups, each including a predetermined number of bit lines.

Each of the n input/output line groups includes a predetermined number of input/output lines. The n connecting circuit groups are provided correspondingly to the n input/output line groups. Each of the n connecting circuit groups includes a plurality of connecting circuits, which are provided correspondingly to the plurality of bit line groups. Each of the plurality of connecting circuits is connected between the corresponding bit line group and the corresponding input/output line group. The column selecting circuit selectively generates a plurality of selecting signals, which correspond to the plurality of connecting circuits in each connecting circuit group, respectively, for selecting any of the plurality of bit line groups.

Each of the plurality of connecting circuits in each connecting circuit group is responsive to the corresponding selecting signal to be activated and connects respective bit lines in the corresponding bit line group to the input/output lines in the corresponding input/output line group. The column selecting circuit includes a circuit which activates a plurality of connecting circuits connected to different input/output line groups in the memory array at the same time or with a predetermined time difference.

A semiconductor memory device according to still another aspect of the invention includes a memory array including a plurality of memory cells and a plurality of bit lines, n input/output line groups, a plurality of connecting circuits, a column selecting circuit, a global input/output line group, a changing circuit, and an input/output line selecting circuit.

The plurality of memory cells are disposed in a plurality of rows and a plurality of columns, and each store data. The plurality of bit lines are provided corresponding to the plurality of columns, and each bit line is connected to the memory cells in the corresponding column. The plurality of bit lines are divided into a plurality of bit line groups, each including a predetermined number of bit lines. The plurality of bit line groups are classified into n main groups. Respective bit line groups in the n main groups are arranged alternately.

The n input/output line groups are provided corresponding to the n main groups, and each input/output line group includes a predetermined number of input/output lines. The plurality of connecting circuits are provided corresponding to the plurality of bit line groups, and each connecting circuits connected between the corresponding bit line group and the corresponding input/output line group. The column selecting circuit selectively generates a plurality of selecting signals, which correspond to the plurality of connecting circuits, respectively, for selecting any of the plurality of bit line groups.

Each of the plurality of connecting circuits is responsive to the corresponding selecting signal to be activated and connects the respective bit lines in the corresponding bit line group to the input/output lines in the corresponding input/output line group. The column selecting circuit includes a circuit which activates a plurality of connecting circuits connected to different input/output line groups in the at the same time or with a predetermined time difference.

The global input/output line group is provided commonly to the n input/output line groups, and includes a predetermined number of input/output lines. The changing circuit selectively connects the respective input/output lines in the n input/output line groups to the corresponding input/output lines in the global input/output line group. The input/output line selecting circuit sequentially selects the respective input/output lines in the global input/output line group.

A semiconductor memory device according to yet another aspect of the invention includes n memory arrays, n input/output line groups, a plurality of connecting circuits, a column selecting circuit, a global input/output line group, a changing circuit and an input/output line selecting circuit.

The n memory arrays are adjacent to each other. Each of the n memory arrays includes a plurality of memory cells, which are arranged in a plurality of rows and a plurality of columns and each store data, and also includes a plurality of bit lines, which are provided corresponding to the plurality of columns and each bit line is connected to the memory cells in the corresponding column. The plurality of bit lines in each memory array are divided into a plurality of bit line groups, each including a predetermined number of bit lines.

The n input/output line groups are provided corresponding to the n memory arrays, and each input/output line includes a predetermined number of input/output lines, which are located near one end of the plurality of bit line groups in the corresponding memory array and extend perpendicularly to the respective bit lines. The plurality of connecting circuits are provided corresponding to the plurality of bit line groups in the n memory arrays, and each connecting circuit is connected between the corresponding bit line group and the corresponding input/output line group. The column selecting circuit selectively generates a plurality of selecting signals, which correspond to the plurality of connecting circuits, respectively, for selecting any of the plurality of bit line groups in the n memory arrays.

Each of the plurality of connecting circuits is responsive to the corresponding selecting signal to be activated and connects the respective bit lines in the corresponding bit line group to the input/output lines in the corresponding input/output line group. The column selecting circuit includes a circuit which activates a plurality of connecting circuits connected to input/output line groups in different memory arrays at the same time or with a predetermined time difference.

The global input/output line group is provided commonly to the n input/output line groups, and includes a predetermined number of input/output lines. The changing circuit selectively connects the respective input/output lines in the n input/output line groups to the corresponding input/output lines in the global input/output line group. The input/output line selecting circuit sequentially selects the respective input/output lines in the global input/output line group.

In the semiconductor-memory devices described above, a plurality of connecting circuits connected to different input/output line groups are activated at the same time or with a predetermined time difference, whereby a plurality of bit line groups can be connected to the corresponding input/output line groups at the same time or with a predetermined time difference, respectively.

Therefore, in the operation for continuously selecting one bit line in a certain bit line group and one bit line in another bit line groups while the input/output line in the one input/output line group is being accessed, data can be prepared on the input/output line of the another input/output line group. Accordingly, the access speed is increased, and gap is not generated between the accessed data.

As described above, the semiconductor memory device according to the invention allows high-speed access. Also, the semiconductor memory device allows various access mode such as a page mode a lap mode and serial mode at a high speed and at a high bit rate. Further, the semiconductor memory device can achieve a high-speed serial mode without restriction of a start address.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a table showing the range which can be accessed in a serial mode without requiring activation of another column selecting circuit;

FIG. 5 is a table showing the range which can be accessed in an address lapping mode without requiring activation of another column selecting circuit;

FIG. 13 shows a truth table of an address conversion logic circuit contained in the input/output line switch circuit;

FIG. 18 is a table showing column selecting circuits activated in a serial mode and accessed range;

FIG. 19 is a table showing column selecting circuits activated in an address lapping mode and accessed range;

FIG. 20 is a timing chart showing an operation in a serial mode of the DRAM in FIG. 15;

FIG. 21 is a timing chart showing an operation in a page mode of the DRAM in FIG. 15;

FIG. 27 is a table showing the range which can be accessed in the DRAM shown in FIGS. 24 and 25 without requiring activation of another column selecting circuit;

FIG. 28 is a timing chart showing an operation in a serial mode of the DRAM in FIGS. 24 and 25; and FIG. 29 is a timing chart showing a disadvantage relating to an operation in a serial mode of the DRAM in FIGS. 24 and 25

DESCRIPTION OF THE PREFERRED EMBODIMENT

(1) First Embodiment

Figure 1:
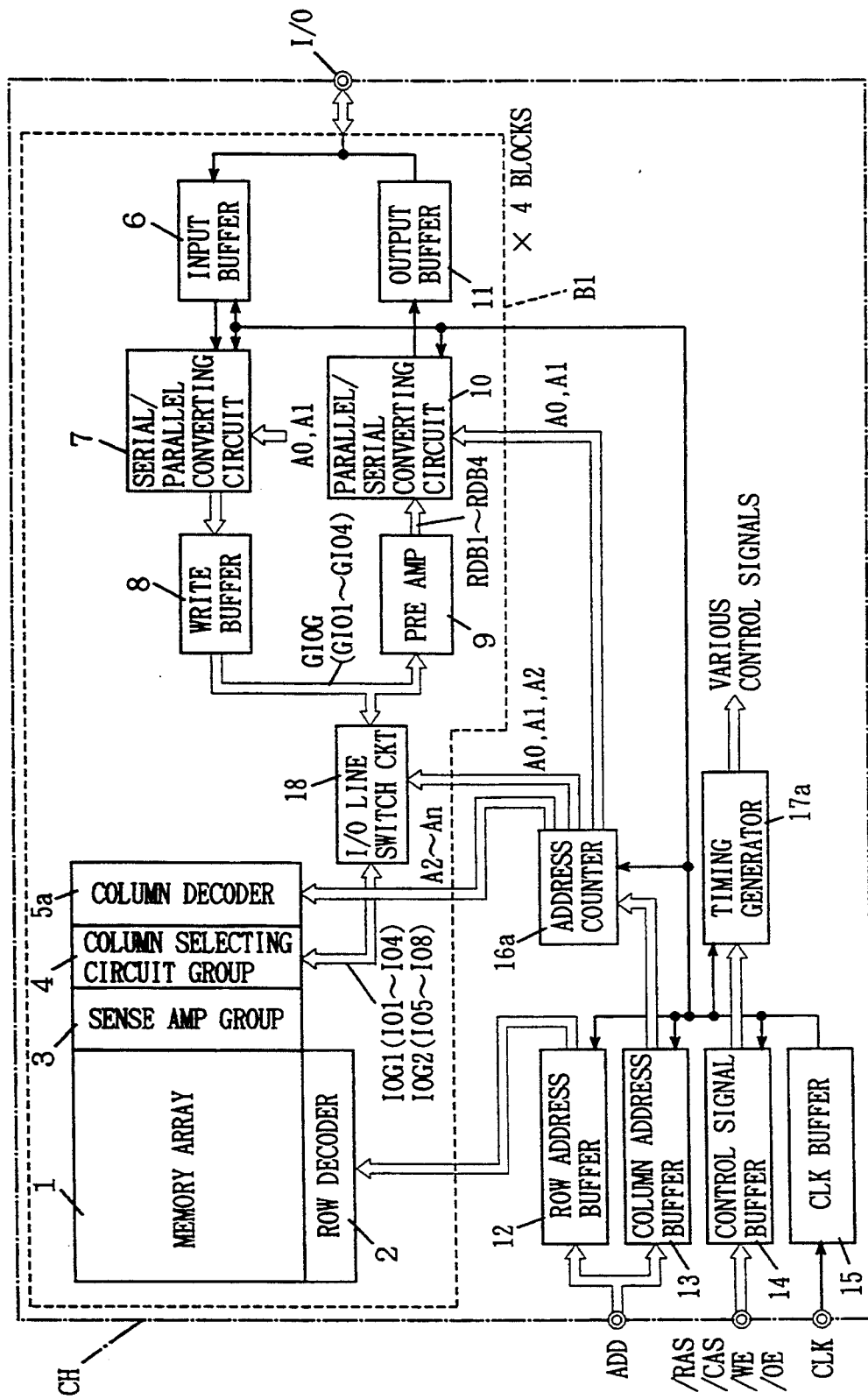
FIG. 1 is a block diagram showing a whole structure of a DRAM of a first embodiment.

FIG. 1 is a block diagram showing a whole structure of a DRAM of a first embodiment. The DRAM in FIG. 1 differs from the DRAM in FIG. 24 in the following points.

There are provided a first input/output line group IOG1 and a second input/output line group IOG2. The first input/output line group IOG1 includes input/output line pairs IO1-IO4. The second input/output line group IOG2 includes input/output line pairs IO5-IO8.

Figure 24:
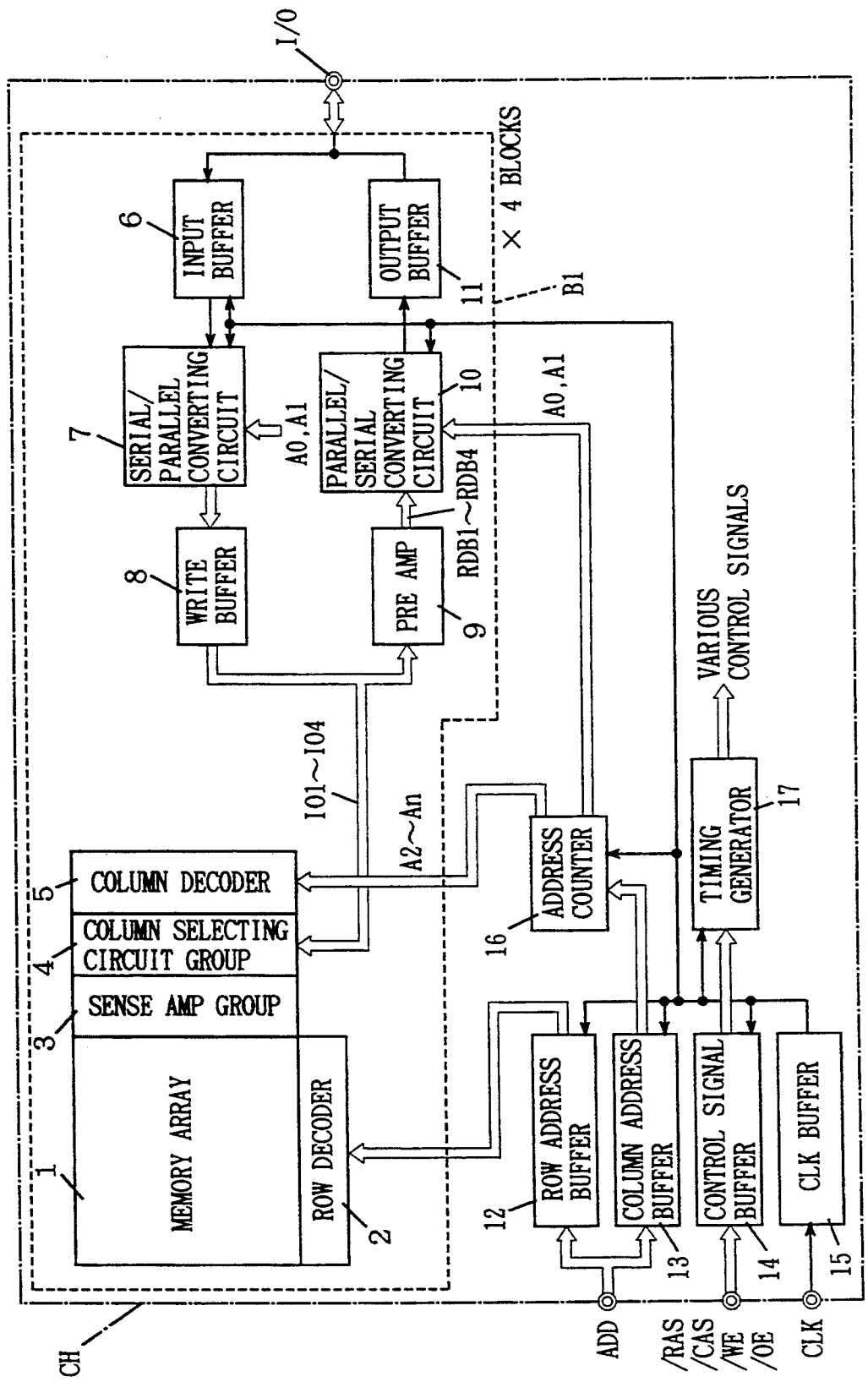
FIG. 24 is a block diagram showing a whole structure of the DRAM in the prior art.

The column decoder 5, address counter 16 and timing generator 17 shown in FIG. 24 are replaced with a column decoder 5a, an address counter 16a and a timing generator 17a. Structures and operations of the column decoder 5a, address counter 16a and timing generator 17a are different from those of the column decoder 5, address counter 16 and timing generator 17, as will be described later.

There is further provided an input/output line switch circuit 18, which receives three bits A0, A1 and A2 in the column address signal sent from the address counter 16a, and selectively connects the input/output line pairs IO1-IO4 in the first input/output line group IOG1 or the input/output line pairs IO5-IO9 in the second input/output line group IOG2 to global input/output lines GIO1-GIO4 in a global input/output line group GIOG. Other structures are similar to those shown in FIG. 24.

Figure 2:
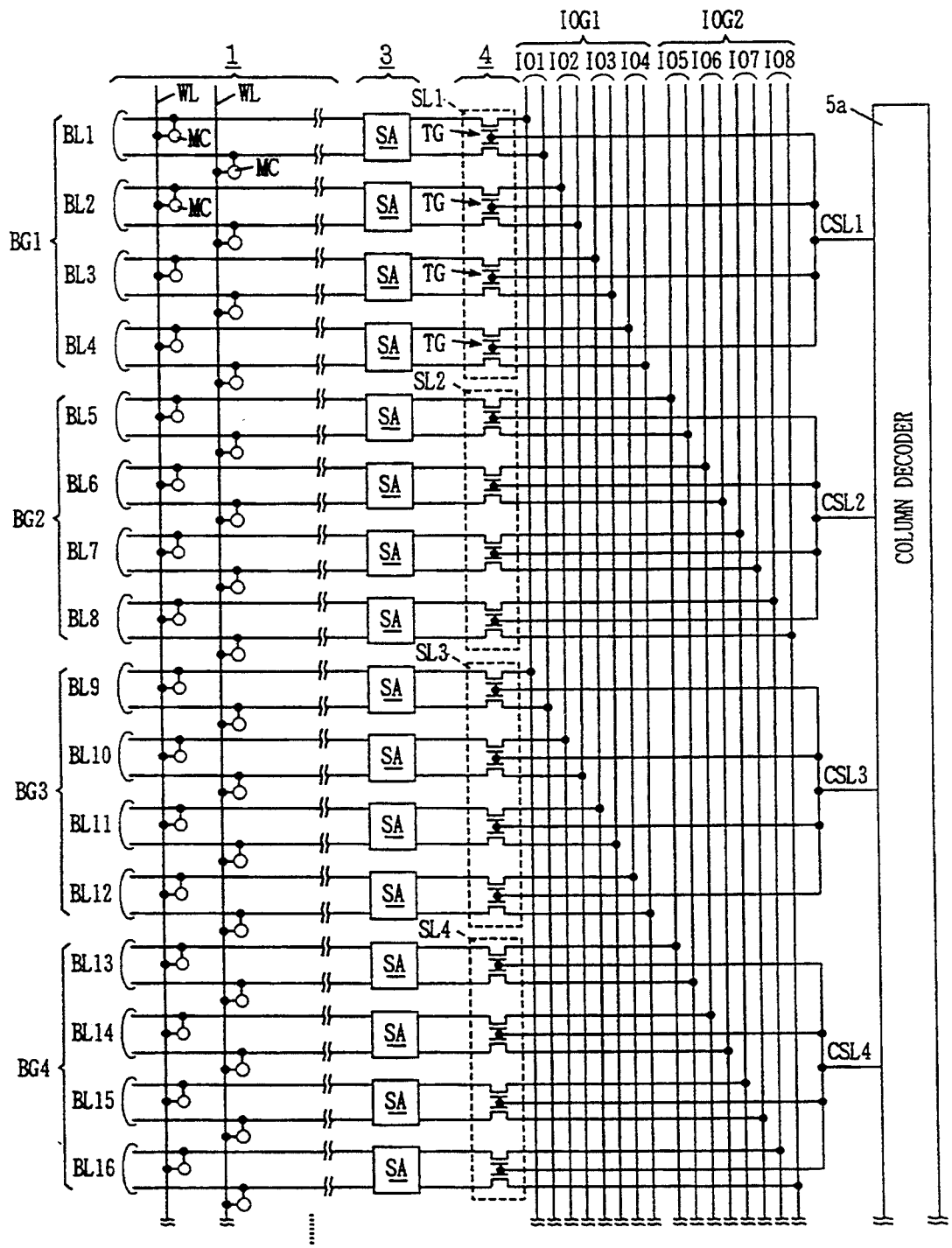
FIG. 2 shows a specific structure of a major part of the DRAM shown in FIG. 1.

FIG. 2 shows a specific structure of a major part of the DRAM shown in FIG. 1.

Figure 25:
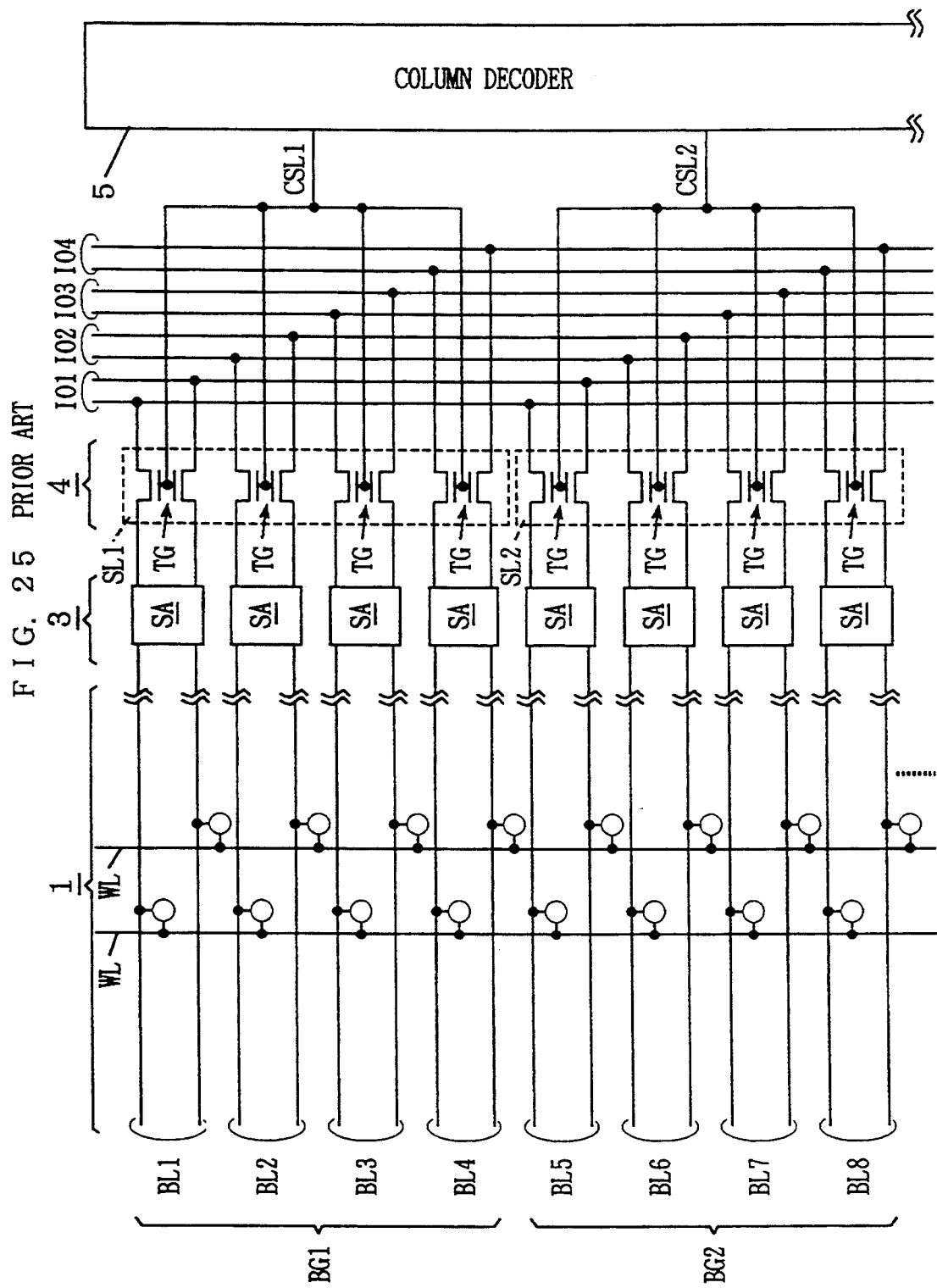
FIG. 25 shows a specific structure of a major part of the DRAM in FIG. 24.
Figure 26:
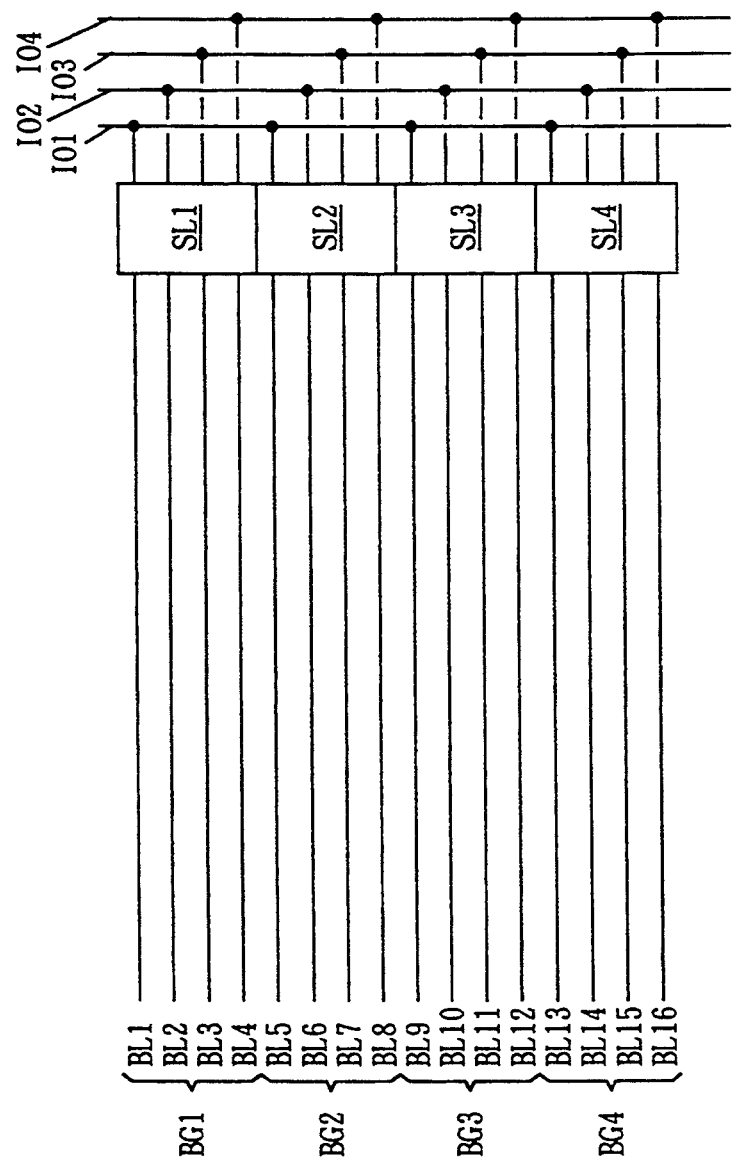
FIG. 26 schematically shows only a major part of the structure shown in FIG. 25.

The memory array 1, sense amplifier group 3 and column selecting circuit group 4 have the structures similar to those shown in FIG. 25. The odd bit line groups, e.g., bit line groups BG1 and BG3 will be referred to as "first bit line groups", and the even bit line groups, e.g., bit line groups BG2 and BG4 will be referred to as "second bit line groups". The plurality of first bit line groups form a first main group, and the plurality of second bit line groups form a second main group.

The four bit line pairs in each first bit line group are connected through the corresponding column selecting circuit to the four input/output line pairs IO1-IO4 in the first input/output line group IOG1, respectively. The four bit line pairs in each second bit line group are connected through the corresponding column selecting circuit to the four input/output line pairs IO5-IO8 in the second input/output line group IOG2, respectively. Each column selecting circuit forms a connecting circuit.

The DRAM in this embodiment has ordinary modes, i.e., the random access mode, page mode and serial mode, and further has an address lapping mode. The serial mode and address lapping mode in the DRAM of this embodiment will be described below.

Figure 3:
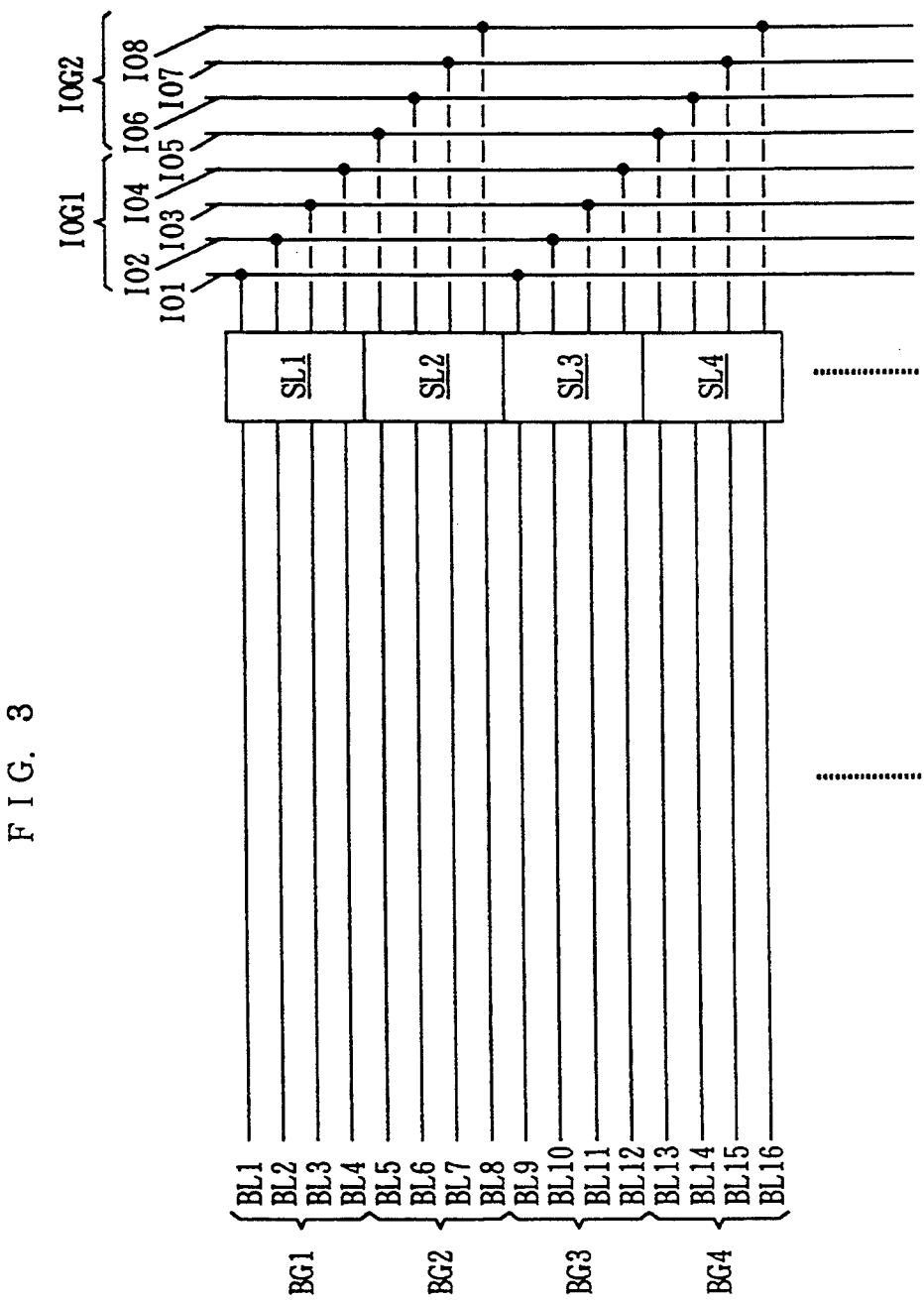
FIG. 3 schematically shows only a major part of the structure shown in FIG. 2.

FIG. 3 schematically shows only a major part of the structure shown in FIG. 2. As shown in FIG. 3, the first bit line groups BG1 and BG3 are connected to the first input/output line group IOG1 through the column selecting circuits SL1 and SL3, respectively. The second bit line groups BG2 and BG4 are connected to the second input/output line group IOG2 through the column selecting circuits SL2 and SL4, respectively.

Therefore, the column selecting circuit corresponding to one of the first bit line groups and the column selecting circuit corresponding to one of the second bit line groups can be activated simultaneously. For example, the column selecting circuits SL1 and SL2 can be activated simultaneously. Also, the column selecting circuits SL2 and SL3 can be activated simultaneously.

As already stated with reference to FIG. 29, the gap can be generated between outpost data in the case where the selected start address is the highest column address (e.g., Y4 or Y8) in each bit line group. In other words, the data gap is generated when one bit line pair in a certain bit line group and one bit line pair in a subsequent bit line group are continuously selected. In this case, therefore, activation of the column selecting circuit corresponding to the start address and the column selecting circuit corresponding to the subsequent column address should be carried out simultaneously or should be carried out sequentially within an extent not generating the data gap.

In other cases, it is not necessary to activate the two column selecting circuits at the same time, and they can be sequentially activated without generating the data gap.

In an actual device, a period of activation of each column selecting circuit is determined in view of the access speed and power consumption.

FIG. 4 is a table showing areas which can be accessed in the serial mode without requiring activation of another column selecting circuit.

If the start address is set at any of Y1 to Y4, the column selecting circuits SL1 and SL2 are initially activated. If the start address is set at any of Y5 to Y8, the column selecting circuits SL2 and SL3 are initially activated. If the start address is set at any of Y8 and Y12, the column selecting circuits SL3 and SL4 are initially activated.

For example, if the start address is set at Y1, the column addresses Y1, Y2, Y3, Y4, Y5, Y6, Y7 and Y8 can be sequentially accessed without activating another column selecting circuit. If the start address is set at Y2, the column addresses Y2, Y3, Y4, Y5, Y6, Y7 and Y8 can be sequentially accessed without activating another column selecting circuit. If the start address is set at Y3, the column addresses Y3, Y4, Y5, Y6, Y7 and Y8 can be sequentially accessed without activating another column selecting circuit. If the start address is set at Y4, the column addresses Y4, Y5, Y6, Y7 and Y8 can be sequentially accessed without activating another column selecting circuit.

As stated above, no matter which column address may be selected as the start address, at least five bits can be continuously accessed without activating another column selecting circuit. Therefore, utilizing a period of this access, operations from the activation of the subsequent column selecting circuit to transfer of data to the parallel/serial converter circuit 10 can be carried out.

FIG. 5 is a table showing the range which can be accessed in the address lapping mode without requiring activation of another column selecting circuit.

If the start address is set at any of Y1 to Y8, the column selecting circuits SL1 and SL2 are initially activated.

For example, if the start address is set at Y1, the column addresses Y1, Y2, Y3, Y4, Y5, Y6, Y7 and Y8 can be sequentially accessed without activating another column selecting circuit. If the start address is set at Y2, the column addresses Y2, Y3, Y4, Y5, Y6, Y7, Y8 and Y1 can be sequentially accessed without activating another column selecting circuit. If the start address is set at Y3, the column addresses Y3, Y4, Y5, Y6, Y7, Y8, Y1 and Y2 can be sequentially accessed without activating another column selecting circuit.

As stated above, no matter which column address may be selected as the start address, at least eight bits can be continuously accessed without activating another column selecting circuit.

Figure 6:
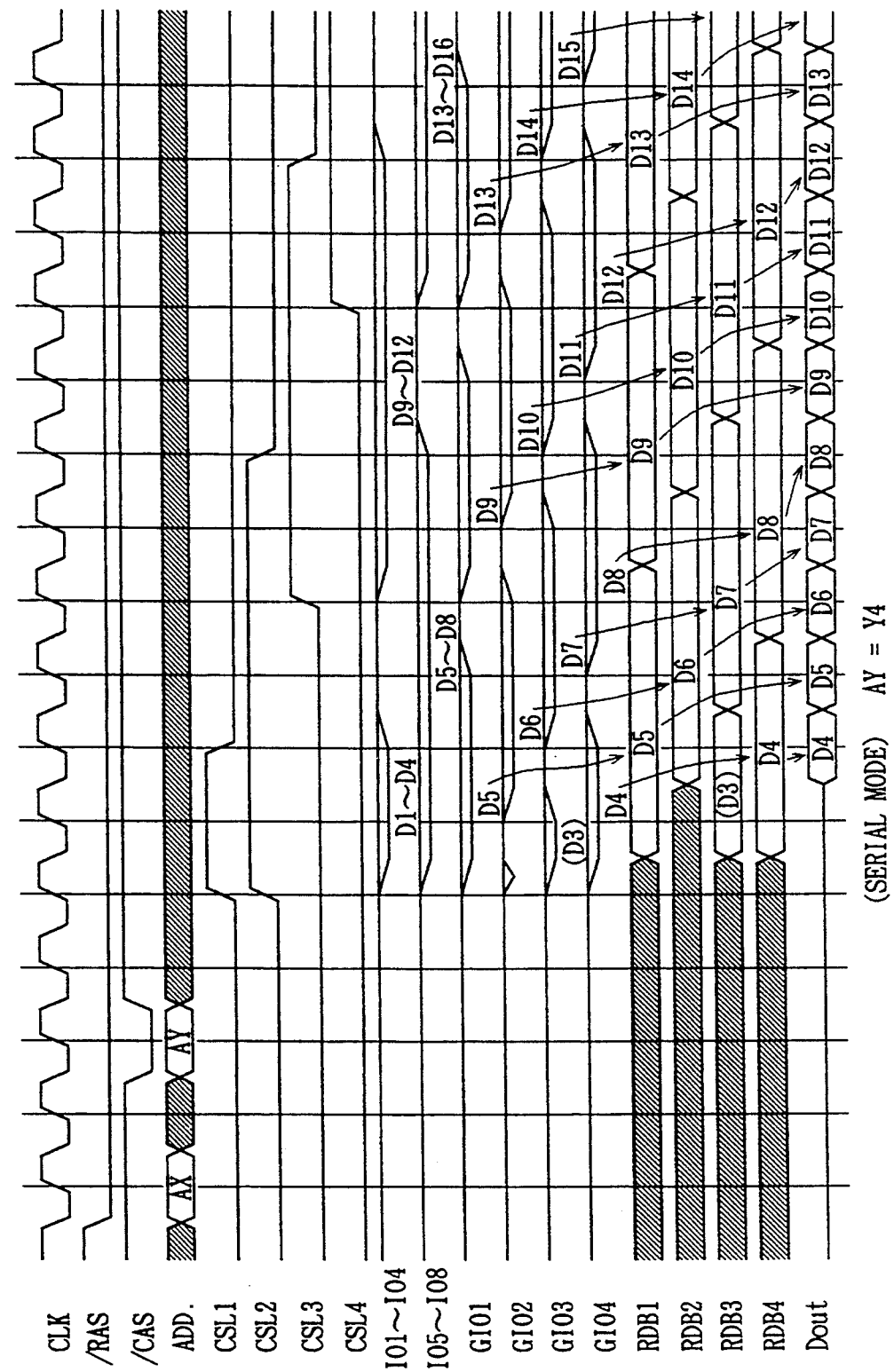
FIG. 6 is a timing chart for showing an operation in a serial mode of a DRAM in FIGS. 1 and 2.
Figure 7:
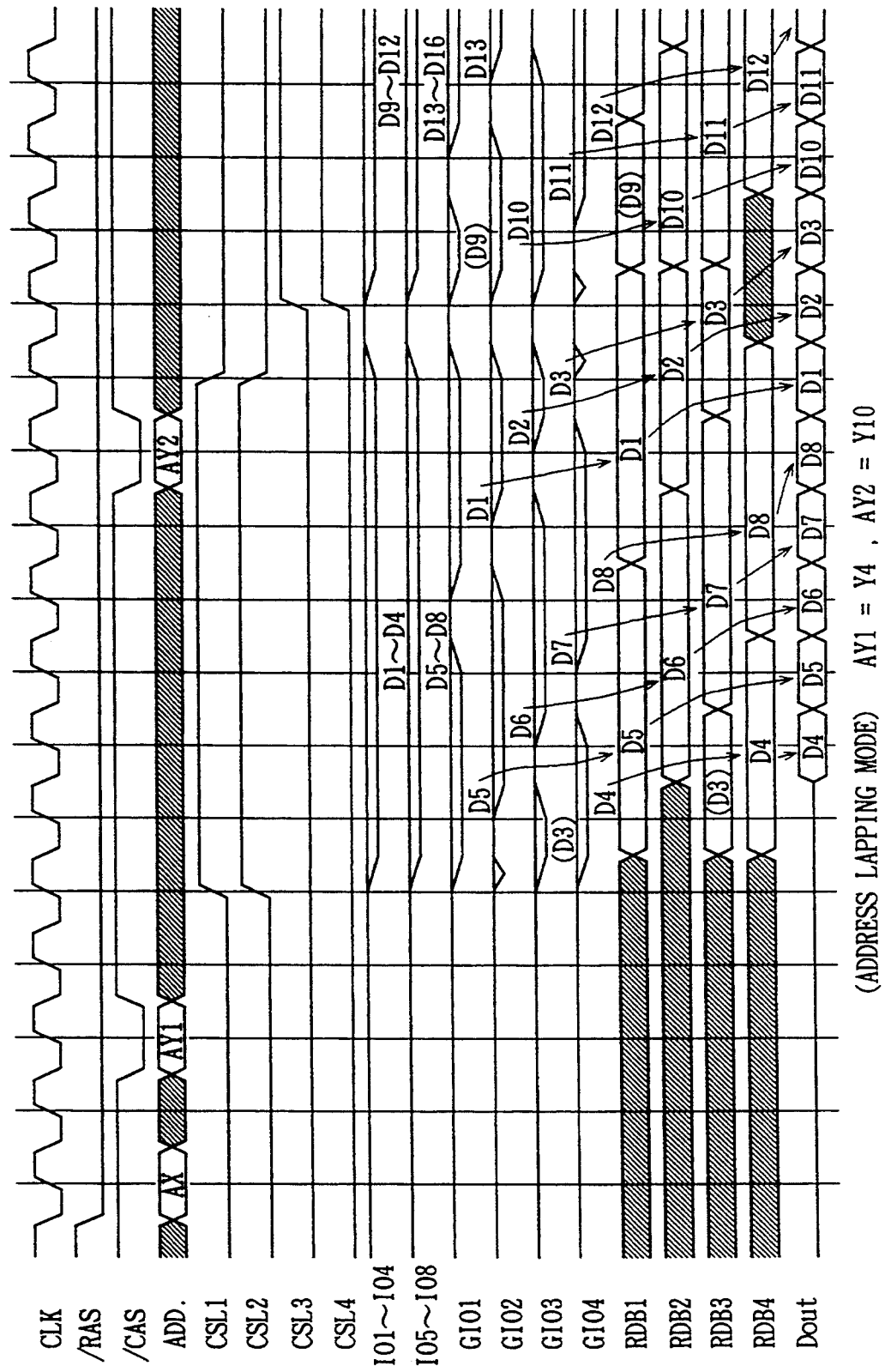
FIG. 7 is a timing chart showing an operation in an address lapping mode of a DRAM in FIGS. 1 and 2.

Then, operations in the serial mode and address lapping mode of the DRAM in this embodiment will be described below with reference to FIGS. 6 and 7. FIG. 6 is a timing chart showing an operation when the start address is set at Y4 in the serial mode. FIG. 7 is a timing chart showing an operation when the first start address is set at Y4 and the second start address is set at Y10 in the address lapping mode.

Referring to FIGS. 6 and 7, D1–D16 show data which are read onto the bit line pairs BL1–BL16, respectively.

In the serial mode, as shown in FIG. 6, when the external row address strobe signal /RAS falls to low, an externally applied address signal ADD is applied as a row address signal AX to the row decoder 2. Thereby, one of the word lines WL is activated.

Thereafter, when the external column address strobe signal /CAS falls to low, an externally applied address signal ADD is applied as a column address signal AY to the address counter 16a. The address counter 16a applies the two bits A0 and A1 in the column address signal AY to the parallel/serial converter circuit 10, and applies the other bits A2–An to the column decoder 5a. Also, the address counter 16a applies the three bits A0, A1 and A2 in the column address signal AY to the input/output line switch circuit 18 for selectively connecting the input/output line pairs IO1–IO8 to the global input/output line pairs GIO1–GIO4.

When the column address AY designates the column address Y4, the start address is set at Y4. The column decoder 5a first raises the column selecting signals CSL1 and CSL2 to high in accordance with a logic, which will be described later, and activates the column selecting circuits SL1 and SL2 at the same time in response to the column address signal AY. Thereby, the data D1–D4 on the bit line pairs BL1–BL4 are read onto the input/output line pairs IO1–IO4, respectively, and the data on the bit line pairs BL5–BL8 are read onto the input/output line pairs IO5–IO8, respectively.

The input/output line switch circuit 18 first connects the input/output line pair IO4 to the global input/output line pair GIO1 in response to the three bits A0, A1 and A2 in the column address signal AY. Thereby, the data D4 is applied through the preamplifier 9 to the read data bus RDB4. Thereafter, the column selecting signal CSL1 falls to low. The parallel/serial converter circuit 10 selects the data D4 and applies the same to the output buffer 11 in response to the two bits A0 and A1 in the column address signal AY.

The input/output line switch circuit 18 sequentially connects the input/output line pairs IO5, IO6, IO7 and IO8 to the global input/output line pairs GIO1, GIO2, GIO3 and GIO4, respectively in response to the three bits A0, A1 and A2 in the column address signal AY, which is sequentially counted up. Thereby, the data D5–D8 are applied to the read date buses RDB1–RDB4 through the preamplifier 9. Thereafter, the column selecting signal CSL2 falls to low. The parallel/serial converter circuit 10 sequentially selects the data D5–D8 and applies the same to the output buffer 11 in response to the two bits A0 and A1 in the column address signal AY, which is sequentially counted up.

Then, after the fall of the column selecting signal CSL1, the column decoder 5a raises the column selecting signal CSL3 to high in accordance with a logic, which will be described later, in response to the column address signal AY, whereby the data D9–D12 are read onto the input/output line pairs IO1–IO4, respectively.

The input/output line switch circuit 18 sequentially connects the input/output line pairs IO1, IO2, IO3 and IO4 to the global input/output line pairs GIO1, GIO2, GIO3 and GIO4, respectively, in response to the three bits A0, A1 and A2 in the column address signal AY, which is sequentially counted up. Thereby, the data D9–D12 are sequentially applied to the read data buses RDB1–RDB4 through the preamplifier 9, respectively.

The parallel/serial converter circuit 10 sequentially selects the data D9–D12 and applies the same to the output buffer 11 in response to the two bits A0 and A1 in the column address signal AY, which is sequentially counted up.

After the fall of the column selecting signal CSL2, the column decoder 5a, raises the column selecting signal CSL4 to high in accordance with a logic, which will be described later in response to the column address signal AY. Thereby, the data D13–D16 are read onto the input/output line pairs IO5–IO8, respectively, The input/output line switch circuit 18 sequentially connects the input/output line pairs IO5, IO6, IO7 and IO8 to the global input/output line pairs GIO1, GIO2, GIO3 and GIO4, respectively, in response to the three bits A0, A1 and A2 in the column address signal AY, which is sequentially counted up. Thereby, the data D13–D16 are sequentially applied to the read data buses RDB1–RDB4 through the preamplifier 9, respectively. The parallel/serial converter circuit 10 sequentially selects the data D13–D16 and applies the same to the output buffer 11 in response to the two bits A0 and A1 in the column address signal AY, which is sequentially counted up.

In this manner, the data are serially supplied from the input/output terminal I/O.

Also in the address lapping mode, as shown in FIG. 7, when the external row address strobe signal /RAS falls to low, an externally applied address signal ADD is applied as a row address signal AX to the row decoder 2.

Thereafter, when the external column address strobe signal /CAS falls to low, an externally applied address signal ADD is applied as a column address signal AY1 to the address counter 16a.

If the column address signal AY1 designates the column address Y4, the first start address is set at Y4. The column decoder 5a raises the column selecting signals CSL1 and CSL2 to high in accordance with a logic, which will be described later, and activates the column selecting circuits SL1 and SL2 at the same time in response to the column address signal AY1. Thereby, the data D1–D4 on the bit line pairs BL1–BL4 are read onto the input/output line pairs IO1–IO4, respectively, and the data on the bit line pairs BL5–BL8 are read onto the input/output line pairs IO5–IO8, respectively.

The input/output line switch circuit 18 connects the input/output line pair IO4 to the global input/output line pair GIO4 in response to the three bits A0, A1 and A2 in the column address signal AY1. Thereby, the data D4 is applied through the preamplifier 9 to the read data bus RDB4. The parallel/serial converter circuit 10 selects the data D4 and applies the same to the output buffer 11 in response to the two bits A0 and A1 in the column address signal AY1.

The input/output line switch circuit 18 sequentially connects the input/output line pairs IO5, IO6, IO7 and IO8 to the global input/output line pairs GIO1, GIO2, GIO3 and GIO4, respectively, in response to the three bits A0, A1 and A2 in the column address signal AY1, which is sequentially counted up. Thereby, the data D5–D8 are applied to the read data buses RDB1–RDB4 through the preamplifier 9. The parallel/serial converter circuit 10 selects data D4–D8 and applies the same to the output buffer 11 in response to the two bits A0 and A1 in the column address signals AY1.

Further, the input/output line switch circuit 18 sequentially connects the input/output line pairs IO1, IO2 and IO3 to the global input/output line pairs GIO1, GIO2 and GIO3, respectively, in response to the three bits A0, A1 and A2 in the column address signal AY1, which is sequentially counted up. Thereby, the data D1–D3 are sequentially applied to the read data buses RDB1–RDB3 through the preamplifier 9, respectively. The parallel/serial converter circuit 10 sequentially selects the data D1–D3 and applies the same to the output buffer 11 in response to the two bits A0 and A1 in the column address signal AY1, which is sequentially counted up.

The column selecting signals CSL1 and CSL2 fall to low when a predetermined time elapses.

In this manner, the data D4, D5, D6, D7, D8, D1, D2 and D3 are serially applied from the input/output terminal I/O.

When the column address strobe signal /CAS falls to low again, an externally applied address signal ADD is applied as a column address signal AY2 to the address counter 16a.

In the case where the column address signal AY2 designates the column address Y10, the second start address is set at Y10. In this case, the column decoder 5a raises the column selecting signals CSL3 and CSL4 to high in accordance with a logic, which will be described later, and activates the column selecting circuits SL3 and SL4 at the same time in response to the column address signal AY2. Thereby, the data D9–D12 on the bit line pairs BL9–BL12 are read onto the input/output line pairs IO1–IO4, respectively, and the data on the bit line pairs BL13–BL16 are read onto the input/output line pair IO5–IO8, respectively.

In this case, the input/output line switch circuit 18 operates as follows in response to the three bits A0, A1 and A2 in the column address signal AY2, which is sequentially counted up. First, the input/output line switch circuit 18 sequentially connects the input/output line pairs IO2, IO3 and IO4 to the global input/output line pairs GIO2, GIO3 and GIO4, then sequentially connects the input/output line pairs IO5, IO6, IO7 and IO8 to the global input/output line pairs GIO1, GIO2, GIO3 and GIO4, and thereafter, connects the input/output line pair IO1 to the global input/output line pair GIO1.

In this manner, the input/output terminal I/O provides the output data D10, D11, D12, D13, D14, D15, D16 and D9.

Now, specific structures of the DRAM of this embodiment will be described below.

Figure 8:
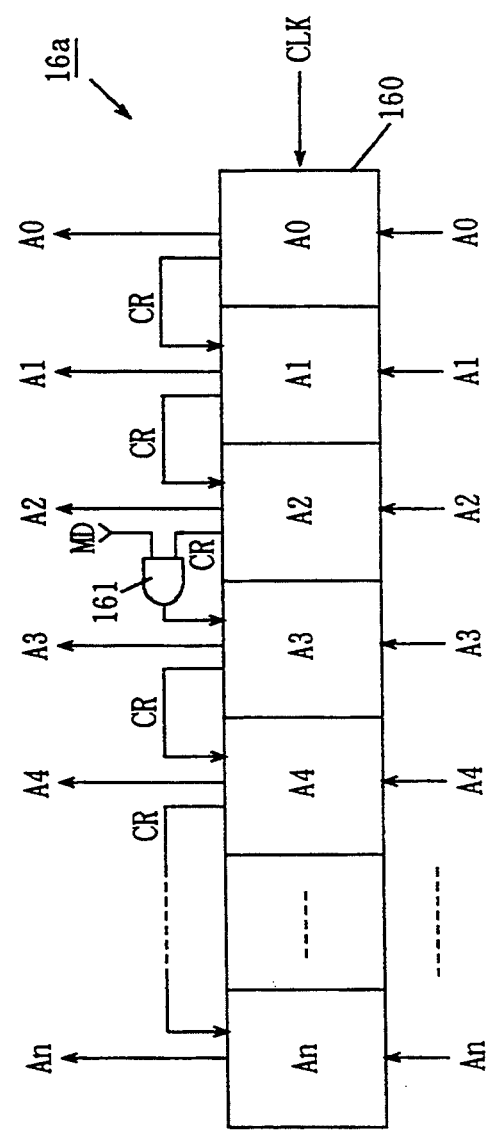
FIG. 8 shows an example of a structure of an address counter.
Figures 9, 10:
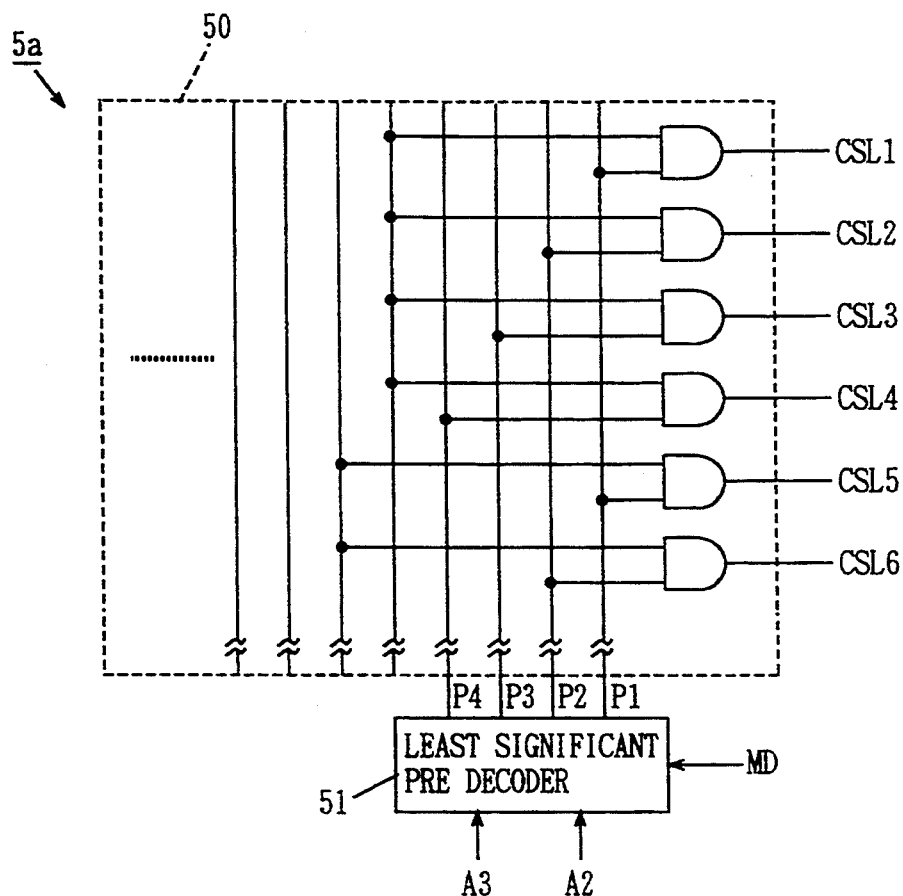
FIG. 9 shows a truth table of the address counter in FIG. 8.
FIG. 10 shows a partial structure of a column decoder.

FIG. 8 shows an example of a structure of the address counter 16a. FIG. 9 shows an example of progress of the address in the address counter 16a in the serial mode and the lapping mode.

The address counter 16a includes a binary counter 160 and an AND gate 161. In the binary counter 160, the column address signal is set as the start address. The binary counter 160 counts up or down the start address and supplies the same in response to the clock signal CLK. The AND gate 161 is connected between a carry pulse output terminal for the third bit and a carry pulse input terminal for the fourth bit in the binary counter 160.

One input terminal of the AND gate 161 receives a mode control signal MD, and the other input terminal thereof receives a carry pulse CR from the carry pulse output terminal for the third bit. The AND gate 161 applies the output signal to the carry pulse input terminal for the fourth bit in the binary counter 160.

In the serial mode, the mode control signal MD is set high. Thereby, the address applied from the address counter 16a progresses as shown in FIG. 9, part a.

In the lapping mode, the mode control signal MD is set low. Thereby, the address generated from the address counter 16a progresses as shown in FIG. 9, part b.

In the serial mode, the column address signal is sequentially incremented by one from the start address in response to the clock signal CLK. In the lapping mode, the three bits A2, A1 and A0 in the column address signal are sequentially incremented by one from the start address to "111" in response to the clock signal CLK, and then are returned to "000". Thereafter, the column address signal is sequentially incremented by one in response to the clock signal CLK.

FIG. 9 shows only five bits A4, A3, A2, A1 and A0 in the address signal. In the serial mode, the bits An–A5 in the column address signal change. In the lapping mode, however, the bits An–A5 in the column address signal do not change from the states at the setting of the start address.

Figures 11, 12:
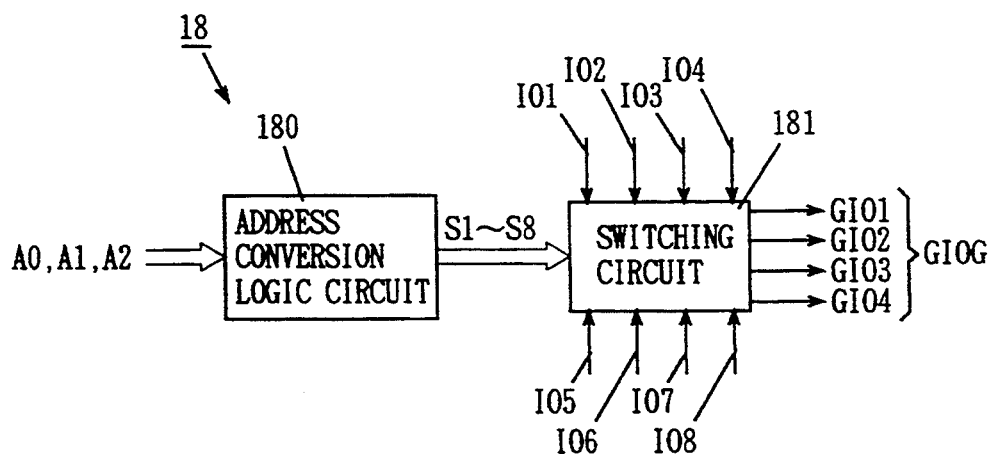
FIG. 11 shows a truth table of a least significant predecode and a truth table of a least significant predecoder in the prior art for comparison.
FIG. 12 shows a structure of an input/output line switch circuit.

FIG. 10 shows a part of a main decoder 50 and a least significant predecoder 51 included in the column decoder 5a. FIG. 11 shows truth tables of the least significant predecoder 51 and a truth table of a least significant predecoder in the prior art for comparison.

The least significant predecoder 51 receives the two bits A2 and A3 in the column address signal as well as the mode control signal MD. The least significant predecoder 51 applies output signals P1–P4 to the main decoder 50. The main decoder 50 raises one or two column selecting signal(s) to high in response to the output signals P1–P4 from the least significant predecoder 51 and output signals from predecoders not shown.

In the conventional predecoder, as shown in FIG. 11 part a, one of the output signals P1–P4 goes to "1" in response to the two bits A2 and A3 in the column address signal.

Meanwhile, in the least significant predecoder 51 shown in FIG. 10, in the serial mode as shown in FIG. 11, part b, two of the output signals P1–P4 go to "1", in response to the two bits A2 and A3 in the column address signal. In the address lapping mode, as shown in FIG. 11, part c, two of the input/output signals P1–P4 go to "1" in response to the two bits A2 and A3 in the column address signal.

In an actual circuit, however, active period of each column selecting signal is adjusted in accordance with the operation mode by logical operation of the respective column selecting signals shown in FIG. 10 and other logic gate signals.

FIG. 12 shows a structure of the input/output line switch circuit 18. The input/output line switch circuit 18 includes an address conversion logic circuit 180 and a switching circuit 181. The address conversion logic circuit 180 receives three bits A0, A1 and A2 in the column address signal, and generates switch signals S1–S8. A truth table of the address conversion logic circuit 180 is shown in FIG. 13. The address conversion logic circuit 180 controls the switching circuit 181 in accordance with the truth table in FIG. 13.

The switching circuit 181 connects one of the input/output line pairs IO1 and IO5, one of the input/output line pairs IO2 and IO6, one of the input/output line pairs IO3 and IO7, and one of the input/output line pairs IO4 and IO8 to the global input/output line pairs GIO1, GIO2, GIO3 and GIO4, respectively, in response to the switch signals S1–S8.

Figure 14:
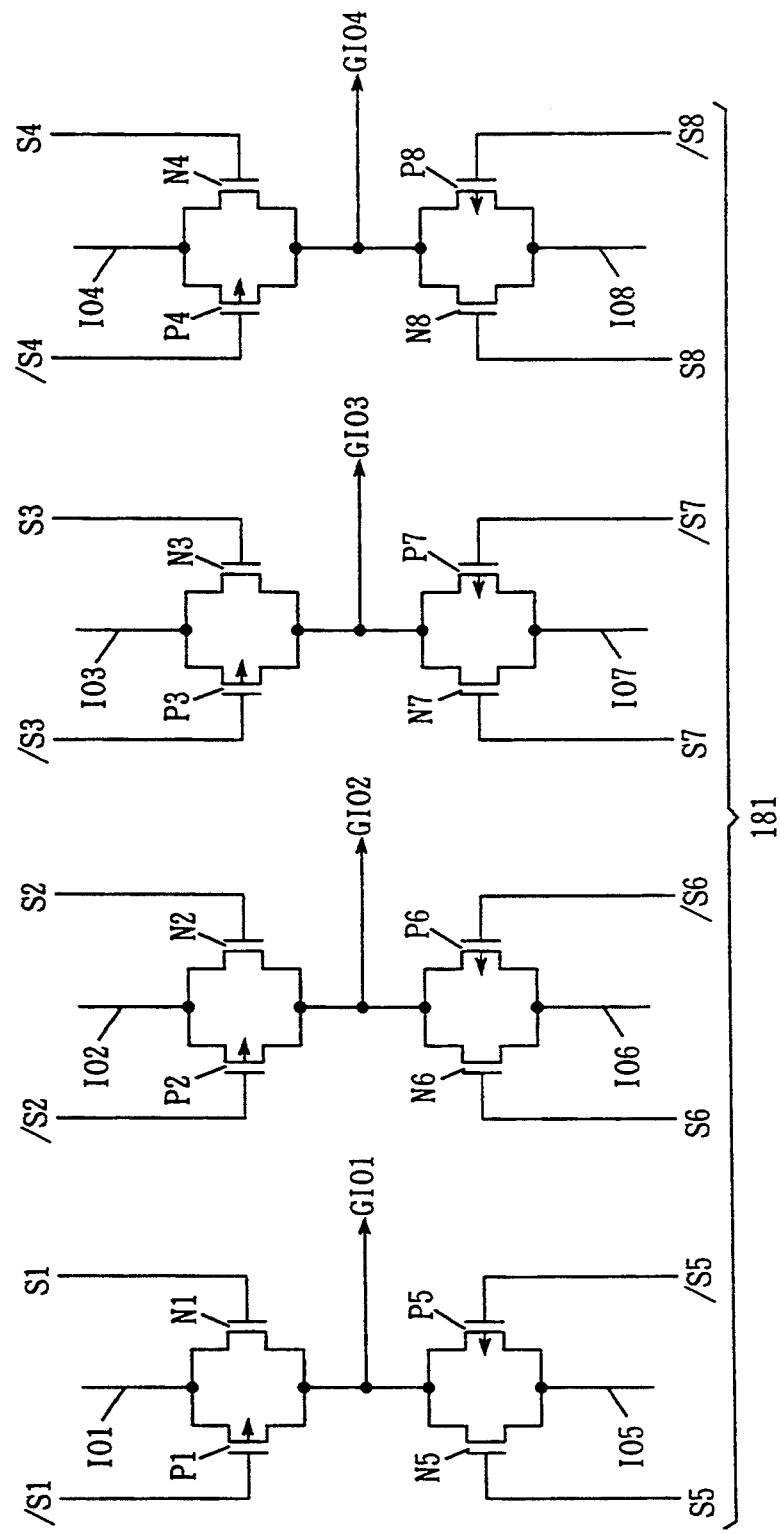
FIG. 14 is a circuit diagram showing a changing circuit of the input/output line switch circuit.

FIG. 14 is a circuit diagram showing a specific structure of the switching circuit 181. The switching circuit 181 includes P-channel transistors P1–P8 and N-channel transistors N1–N8.

When the switch signal S1 is "1", the input/output line pair IO1 is connected to the global input/output line pair GIO1. When the switch signal S5 is "1", the input/output line pair IO5 is connected to the global input/output line pair GIO1. When the switch signal S2 is "1", the input/output line pair IO2 is connected to the global input/output line pair GIO2. When the switch signal S6 is "1", the input/output line pair IO6 is connected to the global input/output line pair GIO2. When the switch signal S3 is "1", the input/output line pair IO3 is connected to the global input/output line pair GIO3. When the switch signal S7 is "1", the input/output line pair IO7 is connected to the global input/output line pair GIO3. When the switch signal S4 is "1", the input/output line pair IO4 is connected to the global input/output line pair GIO4. When the switch signal S8 is "1", the input/output line pair IO8 is connected to the global input/output line pair GIO4.

(2) Second Embodiment

Figure 15:
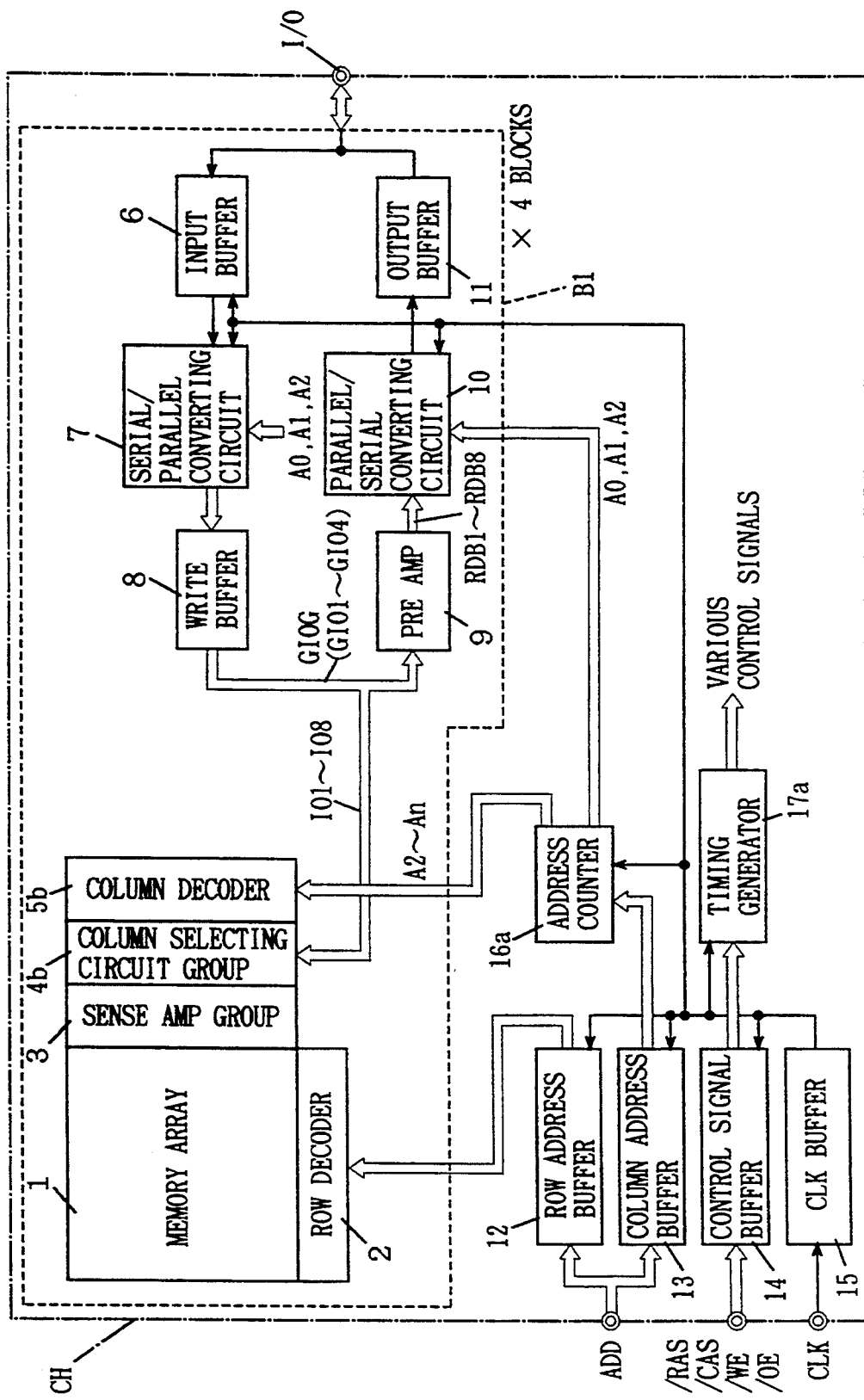
FIG. 15 is a block diagram showing a whole structure of a DRAM of a second embodiment.

FIG. 15 is a block diagram showing a whole structure of a DRAM of a second embodiment. The DRAM of the second embodiment differs from the DRAM of the first embodiment in the following points.

A column selecting circuit group 4b has structures different from those of the column selecting circuit group 4, as will be described later. The input/output line switch circuit 18 in FIG. 1 is eliminated, and the preamplifier 9 is connected through read data buses RDB1–RDB8 to the parallel/serial converter circuit 10. The serial/parallel converter circuit 7 and parallel/serial converter circuit 10 have 8-bit structures, which is also different from the first embodiment.

Figure 16:
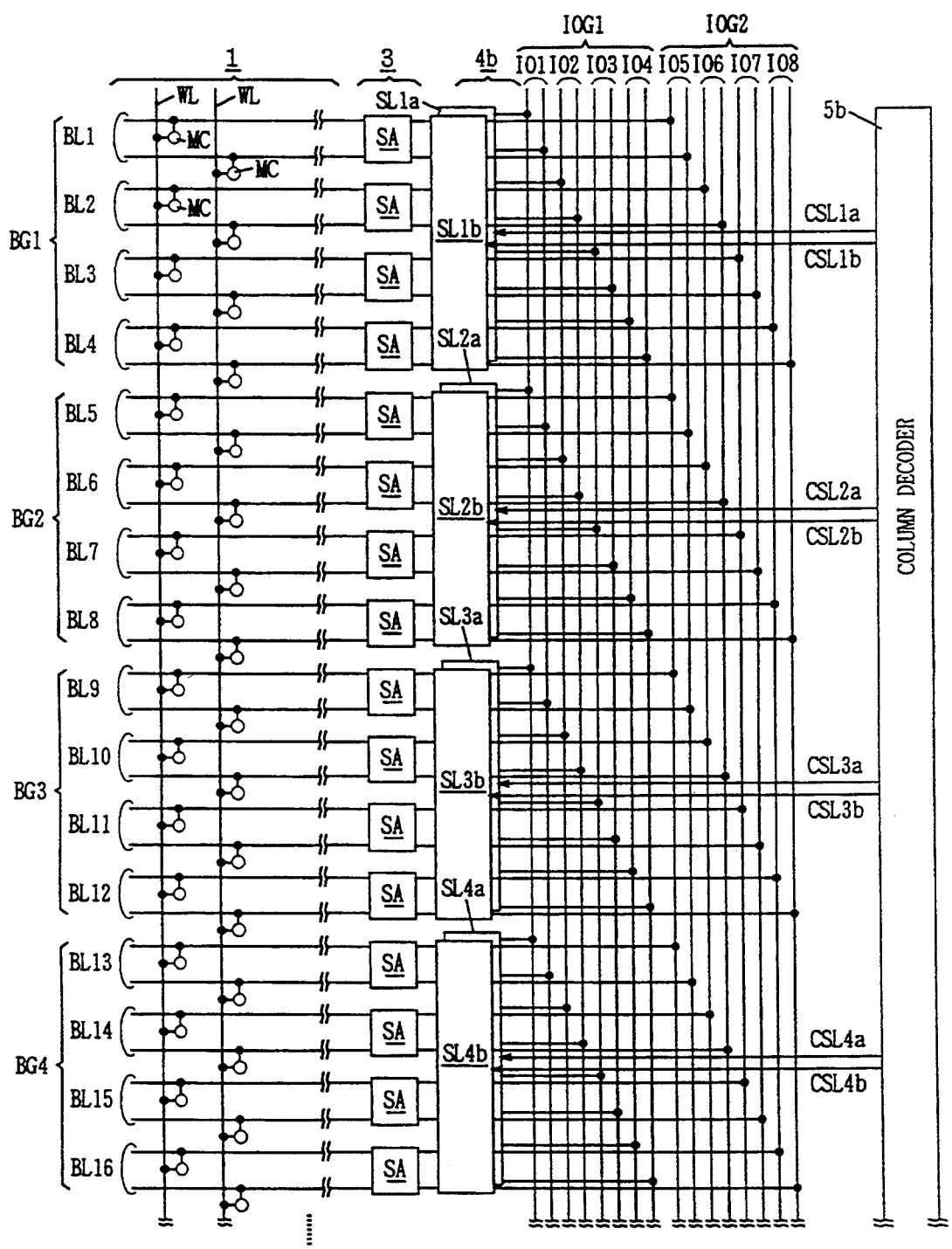
FIG. 16 shows a specific structure of a major part of the DRAM in FIG. 15.

FIG. 16 shows a specific structure of a major part of the DRAM in FIG. 15. In FIG. 16, the memory array 1 and sense amplifier group 3 have structures similar to those shown in FIG. 2. The column selecting circuit group 4b includes a plurality of first column selecting circuits provided corresponding to a plurality of bit line groups, and also includes a plurality of second column selecting circuits provided corresponding to the plurality of bit line groups. In FIG. 16, there are shown first column selecting circuits SL1a–SL4a which correspond to the bit line groups BG1–BG4, respectively, and second column selecting circuits SL1b–SL4b which correspond to the bit line groups BG1–BG4, respectively.

The plurality of finest column selecting circuits form a first connecting circuit group, and the plurality of second column selecting circuits form a second connecting circuit group.

Four bit line pairs in each bit line group are connected through the corresponding first column selecting circuit to the four input/output line pairs IO1–IO4 in the first input/output line group IOG1, and are also connected through the corresponding second column selecting circuit to the four input/output line pairs IO5–IO8 in the second input/output line group IOG2

For example, the bit line pairs BL1–BL4 in the bit line group BG1 are connected through the first column selecting circuit SL1a to the four input/output line pairs IO1–IO4 in the first input/output line group IOG1, respectively, and are also connected through the second column selecting circuit SL1b to the four input/output line pairs IO5–IO8 in the second input/output line group IOG2, respectively. The four bit line pairs in each of the other bit line groups are connected in a similar manner.

The column decoder 5b generates a plurality of first column selecting signals for selecting a plurality of first column selecting circuits in the column selecting circuit group 4b, and also generates a plurality of second column selecting circuits for selecting a plurality of second column selecting signals in the column selecting circuit group 4b. In FIG. 16, the column decoder 5b applies the first column selecting signals CSL1a–CSL4a to the first column selecting circuits SL1a–SL4a, respectively, and applies the second column selecting signals CSL1b–CSL4b to the second column selecting circuits SL1b–SL4b, respectively.

Figure 17:
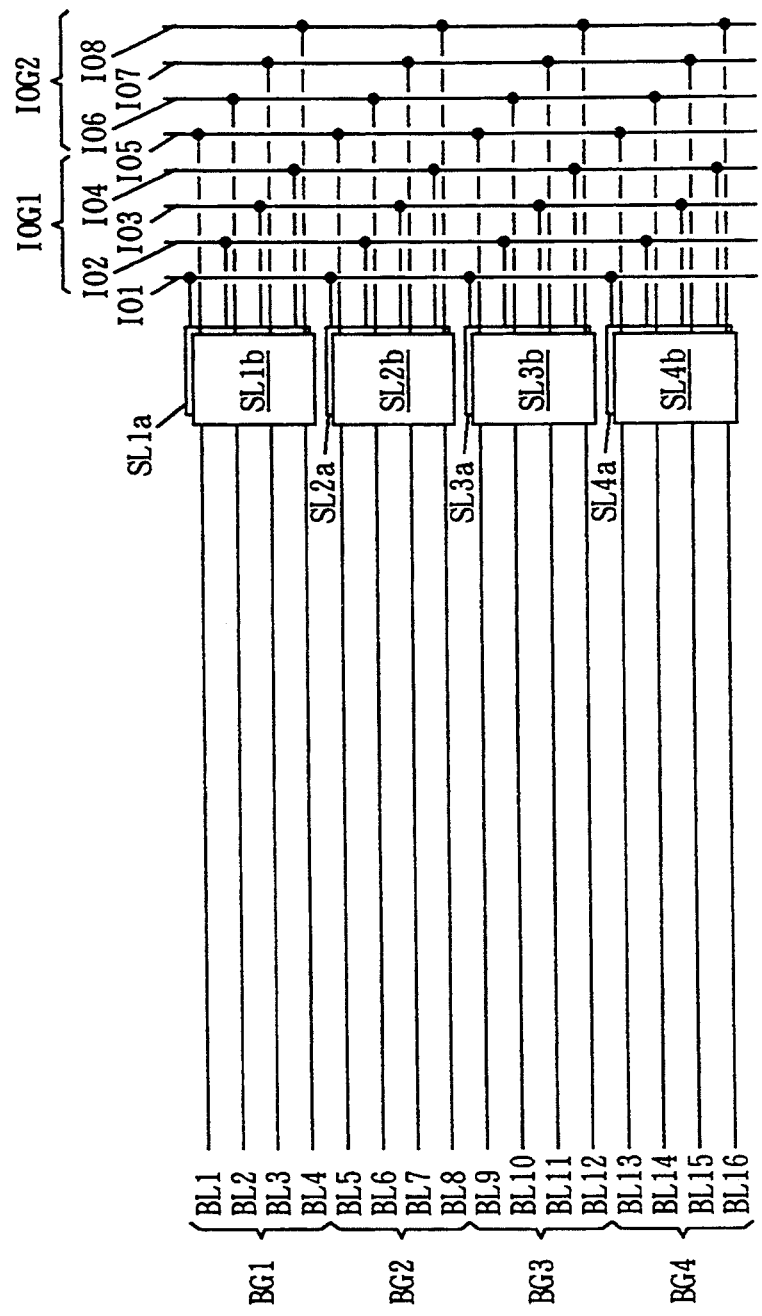
FIG. 17 schematically shows only a major part of the structure shown in FIG. 16.

FIG. 17 schematically shows only a major part of the structure shown in FIG. 16. As shown in FIG. 17, the bit line group BG1 is connected through the first and second column selecting circuits SL1a and SL1b to the first and second input/output line groups IOG1 and IOG2, respectively. The bit line group BG2 is connected through the first and second column selecting circuits SL2a and SL2b to the first and second input/output line groups IOG1 and IOG2, respectively. The bit line group BG3 is connected through the first and second column selecting circuits SL3a and SL3b to the first and second input/output line groups IOG1 and IOG2, respectively. The bit line group BG4 is connected through the first and second column selecting circuits SL4a and SL4b to the first and second input/output line groups IOG1 and IOG2, respectively.

Owing to the above structures, one of the first column selecting circuits and one of the second column selecting circuits can be activated simultaneously. For example, the first column selecting circuit SL1a and the second column selecting circuit SL2b can be activated simultaneously. The second column selecting circuit SL2b and the first column selecting circuit SL3a can be activated simultaneously.

It is impossible to simultaneously activate the first and second column selecting circuits connected to the same bit line group.

FIG. 18 is a table showing column selecting circuits activated in the serial mode and accessed range. FIG. 18 shows the case of reading of eight bits. FIG. 19 is a table showing column selecting circuits activated in the address lapping mode and accessed range.

As already described with reference to FIG. 29, a gap is generated between the output data if the highest column address, e.g., Y4 or Y8 in each bit line group is selected as the start address. In this case, therefore, it is necessary to simultaneously or sequentially activate the first column selecting circuit corresponding to the start address and the second column selecting circuit corresponding to the subsequent column address, or to simultaneously or sequentially activate the second column selecting circuit corresponding to the start address and the first column selecting circuit corresponding to the subsequent column address.

In other cases, since no gap is generated, as shown in FIG. 29, the first or second column selecting circuit can be arbitrarily and sequentially activated correspondingly to the selected column address. Which of the first and second selecting circuit is activated depends on the structure of the column decoder 5b.

In the example shown in FIGS. 18 and 19, the first column selecting circuit is always activated at first. If the number of bits accessed, or the number of bits of data read while the first column selecting circuit is being activated is an even number, then the first column selecting circuits are sequentially activated thereafter. If an odd number of bits are accessed, i.e., if an odd number of data are read while the first column selecting circuit is active, then the second column selecting circuits are sequentially activated thereafter.

In the case of the reading of eight bits shown in FIG. 18, if the start address is set at Y1, the first column selecting circuit SL1a and first column selecting circuit SL2a are sequentially activated in accordance with a predetermined logic. In this case, the column addresses Y1, Y2, Y3 and Y4 are accessed, and further, the column addresses Y5, Y6, Y7 and Y8 are accessed.

Thus, the data on the bit line pairs BL1, BL2, BL3 and BL4 are applied through the first column selecting circuit SL1a onto the input/output line pairs IO1, IO2, IO3 and IO4, and the data on the bit line pairs BL5, BL6, BL7 and BL8 are applied through the first column selecting circuit SL2a to the input/output line pairs IO1, IO2, IO3 and IO4.

If the start address is set at Y2, the first column selecting circuit SL1a, second column selecting circuit SL2b and second column selecting circuit SL3b are sequentially activated in accordance with a predetermined logic. In this case, the column addresses Y2, Y3 and Y4 are accessed, the column addresses Y5, Y6, Y7 and Y8 are accessed, and further the column address Y9 is accessed.

Thus, the data on the bit line pairs BL2, BL3 and BL4 are applied through the first column selecting circuit SL1a to the input/output line pairs IO2, IO3 and IO4. The data on the bit line pairs BL5, BL6, BL7 and BL8 are applied through the second column selecting circuit SL2b to the input/output line pairs IO5, IO6, IO7 and IO8. Further, the data on the bit line pair BL9 is applied through the second column selecting circuit SL3b to the input/output line pair IO5.

If the start address is set at Y3, the first column selecting circuit SL1a, first column selecting circuit SL2a and first column selecting circuit SL3a are sequentially activated in accordance with a predetermined logic. In this case, the column addresses Y3 and Y4 are accessed, the column addresses Y5, Y6, Y7 and Y8 are accessed, and further the column addresses Y9 and Y10 are accessed.

Thus, the data on the bit line pairs BL3 and BL4 are applied through the first column selecting circuit SL1a to the input/output line pairs IO3 and IO4. The data on the bit line pairs BL5, BL6, BL7 and BL8 are applied through the first column selecting circuit SL2a to the input/output line pairs IO1, IO2, IO3 and IO4. Further, the data on the bit line pairs BL9 and BL10 are applied through the first column selecting circuit SL3a to the input/output line pairs IO1 and IO2.

If the start address is set at Y4, the first column selecting circuit SL1a and second column selecting circuit SL2b are activated simultaneously or sequentially and further, the second column selecting circuit SL3b is activated in accordance with a predetermined logic. In this case, the column address Y4 is accessed, the column addresses Y5, Y6, Y7 and Y8 are accessed, and further the column addresses Y9, Y10 and Y11 are accessed.

Thus, the data on the bit line pair BL4 is applied through the first column selecting circuit SL1a to the input/output line pair IO1. The data on the bit line pairs BL5, BL6, BL7 and BL8 are applied through the first column selecting circuit SL2a to the input/output line pairs IO5, IO6, IO7 and IO8. Further, the data on the bit line pairs BL9, BL10 and BL11 are applied through the second column selecting circuit SL3b to the input/output line pairs IO5, IO6 and IO7.

As described above, if the start address is set at Y4, the first column selecting circuit SL1a and the second column selecting circuit SL2b are activated simultaneously or sequentially.

Therefore, whatever the column address may be selected as the start address, the continuous serial access is allowed.

In FIG. 19, if the start address is set, for example, at Y1, the first column selecting circuit SL1a and first column selecting circuit SL2a are sequentially activated in accordance with a predetermined logic. In this case, the column addresses Y1, Y2, Y3 and Y4 are accessed, and further the column addresses Y5, Y6, Y7 and Y8 are accessed.

Thus, the data on the bit line pairs BL1, BL2, BL3 and BL4 are applied through the first column selecting circuit SL1a to the input/output line pairs IO1, IO2, IO3 and IO4. Further, the data on the bit line pairs BL5, BL6, BL7 and BL8 are applied through the first column selecting circuit SL2a to the input/output line pairs IO1, IO2, IO3 and IO4.

If the start address is set at Y2, the first column selecting circuit SL1a, second column selecting circuit SL2b and second column selecting circuit SL1b are sequentially activated in accordance with a predetermined logic. In this case, the column addresses Y2, Y3 and Y4 are accessed, the column addresses Y5, Y6, Y7 and Y8 are accessed, and further the column address Y1 is accessed.

Thus, the data on the bit line pairs BL2, BL3 and BL4 are applied through the first column selecting circuit SL1a to the input/output line pairs IO2, IO3 and IO4. The data on the bit line pairs BL5, BL6, BL7 and BL8 are applied through the second column selecting circuit SL2b to the input/output line pairs IO5, IO6, IO7 and IO8. Further, the data on the bit line pair BL1 is applied through the second column selecting circuit SL1b to the input/output line pair IO5.

If the start address is set at Y3, the first column selecting circuit SL1a, first column selecting circuit SL2a and first column selecting circuit SL1a are sequentially activated in accordance with a predetermined logic. In this case, the column addresses Y3 and Y4 are accessed, the column addresses Y5, Y6, Y7 and Y8 are accessed, and further the column addresses Y1 and Y2 are accessed.

Thus, the data on the bit line pairs BL3 and BL4 are applied through the first column selecting circuit SL1a to the input/output line pairs IO3 and IO4. The data on the bit line pairs BL5, BL6, BL7 and BL8 are applied through the first column selecting circuit SL2a to the input/output line pairs IO1, IO2, IO3 and IO4. Further, the data on the bit line pairs BL1 and BL2 are applied through the first column selecting circuit SL1a to the input/output line pairs IO1 and IO2.

If the start address is set at Y4, the first column selecting circuit SL1a and second column selecting circuit SL2b are activated simultaneously or sequentially, and further, the second column selecting circuit SL1b is activated in accordance with a predetermined logic. In this case, the column address Y4 is accessed, the column addresses Y5, Y6, Y7 and Y8 are accessed, and further the column addresses Y1, Y2 and Y3 are accessed.

Thus, the data on the bit line pair BL4 is applied through the first column selecting circuit SL1a to the input/output line pair IO4. The data on the bit line pairs BL5, BL6, BL7 and BL8 are applied through the second column selecting circuit SL2b to the input/output line pairs IO5, IO6, IO7 and IO8. Further, the data on the bit line pairs BL1, BL2 and BL3 are applied through the second column selecting circuit SL1b to the input/output line pairs IO5, IO6 and IO7.

As described above, if the start address is set at Y4, the first column selecting circuit SL1a and the second column selecting circuit SL2b are activated simultaneously or sequentially.

Therefore, whatever the column address may be selected as the start address, the continuous address lapping is allowed.

Now, operations in the serial mode and page mode of the DRAM in this embodiment will be described with reference to FIGS. 20 and 21. FIG. 20 is a timing chart showing an operation when the start address is set at Y4 in a serial mode. FIG. 21 is a timing chart showing an operation in which random selection of the column is carried out in the page mode.

In the serial mode, as shown in FIG. 20, when the external row address strobe signal /RAS falls to low, an externally applied address signal ADD is applied as a row address signal AX to the row decoder 2. Thereafter, when the external column address strobe signal /CAS falls to low, an externally applied address signal ADD is applied as a column address signal AY to the address counter 16a.

If the column address signal AY designates the column address Y4, the start address is set at Y4. The column decoder 5b sequentially activates the first column selecting signal CSL1a and second column selecting signal CSL2b in accordance with a predetermined logic in response to the column address signal AY. Thereby, the data D1–D4 on the bit line pairs BL1–BL4 are read onto the input/output line pairs IO1–IO4, respectively, and the data D5–D8 on the bit line pairs BL5–BL8 are read onto the input/output line pairs IO5–I8, respectively.

The data D1–D4 on the input/output line pairs IO1–IO4 and the data D5–D8 on the input/output line pairs IO5–IO8 are amplified by the preamplifier 9, and are applied to the read data buses RDB1–RDB8, respectively. The parallel/serial converter circuit 10 sequentially selects the data D4–D8 and applies the same to the output buffer 11 in response to the three bits A0, A1 and A2 in the column address signal AY, which is sequentially counted up.

After the fall of the column selecting signal CSL2b, the column decoder 5b raises the second column selecting signal CSL3b to high in accordance with a predetermined logic in response to the column address signal AY. Thereby, the data D9–D12 are read onto the input/output line pairs I5–IO8, respectively. The data D9–D12 on the input/output line pairs IO5–IO8 are amplified by the preamplifier 9, and are applied to the read data buses RDB5–RDB8, respectively. The parallel/serial converter circuit 10 sequentially selects the data D9–D12 and applies the same to the output buffer 11 in response to the three bits A0, A1 and A2 in the column address signal AY, which is sequentially counted up.

After the fall of the column selecting signal CSL3*b*, the column decoder 5*b* raises the second column selecting signal CSL4*b* to high in accordance with a predetermined logic in response to the column address signal AY. Thereby, the data D13-D16 are read onto the input/output line pairs IO5-IO8, respectively.

In this manner, the data are serially supplied from the input/output terminal I/O.

Also in the page mode, as shown in FIG. 21, when the external row address strobe signal /RAS falls to low, an externally applied address signal ADD is applied as a row address signal AX to the row decoder 2. Thereafter, when the external column address strobe signal /CAS falls to low, address signals ADD, which are received externally and randomly, are applied as column address signals AY1, AY2, AY3, . . . to the address counter 16*a*.

In an example in FIG. 21, the column address signals AY1-AY10 designate the column addresses Y3, Y6, Y11, Y4, Y8, Y7, Y2, Y9, Y5 and Y10, respectively.

The column decoder 5*b* raises the first column selecting signal CSL1*a* to high and activates the first column selecting circuit SL1*a* in accordance with a predetermined logic in response to the column address signal AY1. Thereby, the data D1-D4 on the bit line pairs BL1-BL4 are read onto the input/output line pairs IO1-IO4, respectively. The data D1-D4 on the input/output line pairs IO1-IO4 are amplified by the preamplifier 9, and are applied to the read data buses RDB1-RDB4, respectively. The parallel/serial converter circuit 10 selects the data D3 and applies the same to the output buffer 11 in response to the three bits A0, A1 and A2 in the column address signal AY1.

Then, the column decoder 5*b* raises the second column selecting signal CSL2*b* to high and activates the second column selecting circuit SL2*b* in accordance with a predetermined logic in response to the column address signal AY2. Thereby, the data D5-D8 on the bit line pairs BL5-BL8 are read onto the input/output line pairs IO5-IO8, respectively. The data D5-D8 on the input/output line pairs IO5-IO8 are amplified by the preamplifier 9, and are applied to the read data buses RDB5-RDB8, respectively. The parallel/serial converter circuit 10 selects the data D6 and applies the same to the output buffer 11 in response to the three bits A0, A1 and A2 in the column address signal AY2.

After the fall of the first column selecting signal CSL1*a*, the column decoder 5*b* raises the first column selecting signal CSL3*a* to high and activates the first column selecting circuit SL3*a* in accordance with a predetermined logic in response to the column address signal AY3. Thereby, the data D9-D12 on the bit line pairs BL9-BL12 are read onto the input/output line pairs IO1-IO4, respectively. The data on the input/output line pairs IO1-IO4 are amplified by the preamplifier 9, and are applied to the read data buses RDB1-RDB4, respectively. The parallel/serial converter circuit 10 selects the data D11 and applies the same to the output buffer 11 in response to the three bits A0, A1 and A2 in the column address signal AY3.

After the fall of the second column selecting signal CSL2*b*, the column decoder 5*b* raises the second column selecting signal CSL1*b* to high and activates the second column selecting circuit SL1*b* in accordance with a predetermined logic in response to the column address signal AY4. Thereby, the data D1-D4 on the bit line pairs BL1-BL4 are read onto the input/output line pairs IO5-IO8, respectively. The data D1-D4 on the input/output line pairs IO5-IO8 are amplified by the preamplifier 9, and are applied to the read data buses RDB5-RDB8, respectively. The parallel/serial converter circuit 10 selects the data D4 and applies the same to the output buffer 11 in response to the three bits A0, A1 and A2 in the column address signal AY.

The column decoder 5*b* raises the first column selecting signal CSL2*a* to high after the fall of the first column selecting signal CSL3*a*, and raises the second column selecting signal CSL3*b* to high after the fall of the second column selecting signal CSL1*b*, for sequentially activating the first column selecting circuit SL2*a* and the second column selecting circuit SL3*b*. Thereby, the data D5-D8 on the bit line pairs BL5-BL8 are read onto the input/output line pairs IO1-IO4, respectively, and the data D9-D12 on the bit line pairs BL9-BL12 are read onto the input/output line pairs IO5-IO8, respectively.

In this manner, the input/output terminal I/O applies in serial the data D3, D6, D11, D4, D8, D7, D2, D9, D5 and D10.

In the page mode for carrying out the random selection of the columns, the first column selecting circuit and the second column selecting circuit are alternately selected.

Therefore, two bit line groups can be connected simultaneously or sequentially to the first and second input/output line groups IOG1 and IOG2, respectively. Therefore, while a certain column address is being accessed, the column selection can be simultaneously carried out for the subsequent column address. This enables the continuous high-speed access also in the page mode.

Figure 22:
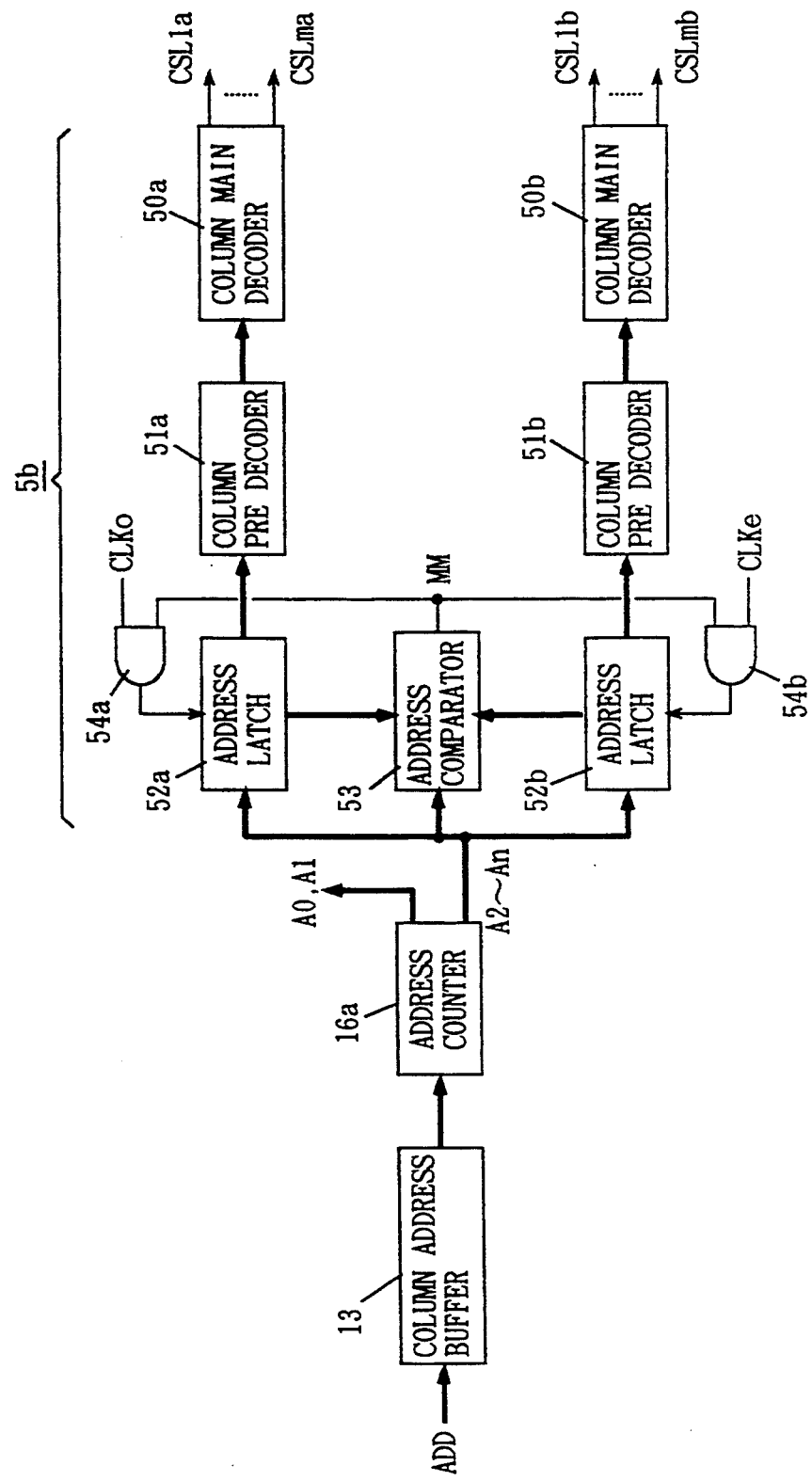
FIG. 22 is a block diagram showing an example of a structure of a column decoder included in the DRAM in FIG. 15.

FIG. 22 shows a structure of a major part of the column decoder 5*b*.

The column decoder 5*b* includes column main decoders 50*a* and 50*b*, column predecoders 51*a* and 51*b*, address latches 52*a* and 52*b*, an address comparator 53, and AND gates 54*a* and 54*b*.

If the external column address strobe signal /CAS is low, the column address signal applied from the column address buffer 13 is set at the address counter 16*a*.

The address counter 16*a* carries out a count-up operation if the external column address strobe signal /CAS is high.

The address latches 52*a* and 52*b* as well as the address comparator 53 receive the bits A2-An in the column address signal applied from the address counter 16*a*. The address comparator 53 compares the column address signal applied from the address counter 16*a* with the column address signal latched by each of the address latches 52*a* and 52*b*, and generates an output signal MM indicating a result of comparison.

The AND gate 54*a* has one input terminal which receives an odd number clock signal CLKo, and the other input terminal which receives an even number clock signal CLKe. The odd number clock signal CLKo becomes high in response to a pulse at an odd order of the clock signal CLK after the first input of the column address signal. The even number clock signal CLKe becomes high in response to a pulse at an even order of the clock signal CLK after the first input of the column address signal. The output signal MM of the address comparator 53 becomes low when the comparison result indicates the coincidence, and becomes high when the comparison result indicates noncoincidence.

When the output signal of the AND gate 54*a* becomes high, the address latch 52*a* latches the column address signal applied from the address counter 16a and supplies the same to the column predecoder 51a. The column predecoder 51a predecodes the column address signal applied from the address latch 52a, and applies the predecoded signal to the column main decoder 50a. The column main decoder 50a decodes the output signal of the column predecoder 51a, and activates one of the column selecting signals CSL1a-CSLma.

When the output signal of the AND gate 54b becomes high, the address latch 52b latches the column address signal applied from the address counter 16a, and supplies the same to the column predecoder 51b. The column predecoder 51b predecodes the column address signal applied from the address Latch 52b, and applies the predecoded signal to the column main decoder 50b. The column main decoder 50b decodes the output signal of the column predecoder 51b, and activates one of the second column selecting signals CSL1b-CSLmb.

According to the column decoder 5b shown in FIG. 22, when a new column address signal is applied thereto concurrently with generation of the pulse at an odd order of the clock signal CLK after the reception of the first column address signal, one of the first column selecting signals is activated. When a new column address signal is applied thereto concurrently with generation of the pulse at an even order of the clock signal CLK after the reception of the first column address signal, one of the second column selecting signals is activated.

(3) Third Embodiment

Figure 23:
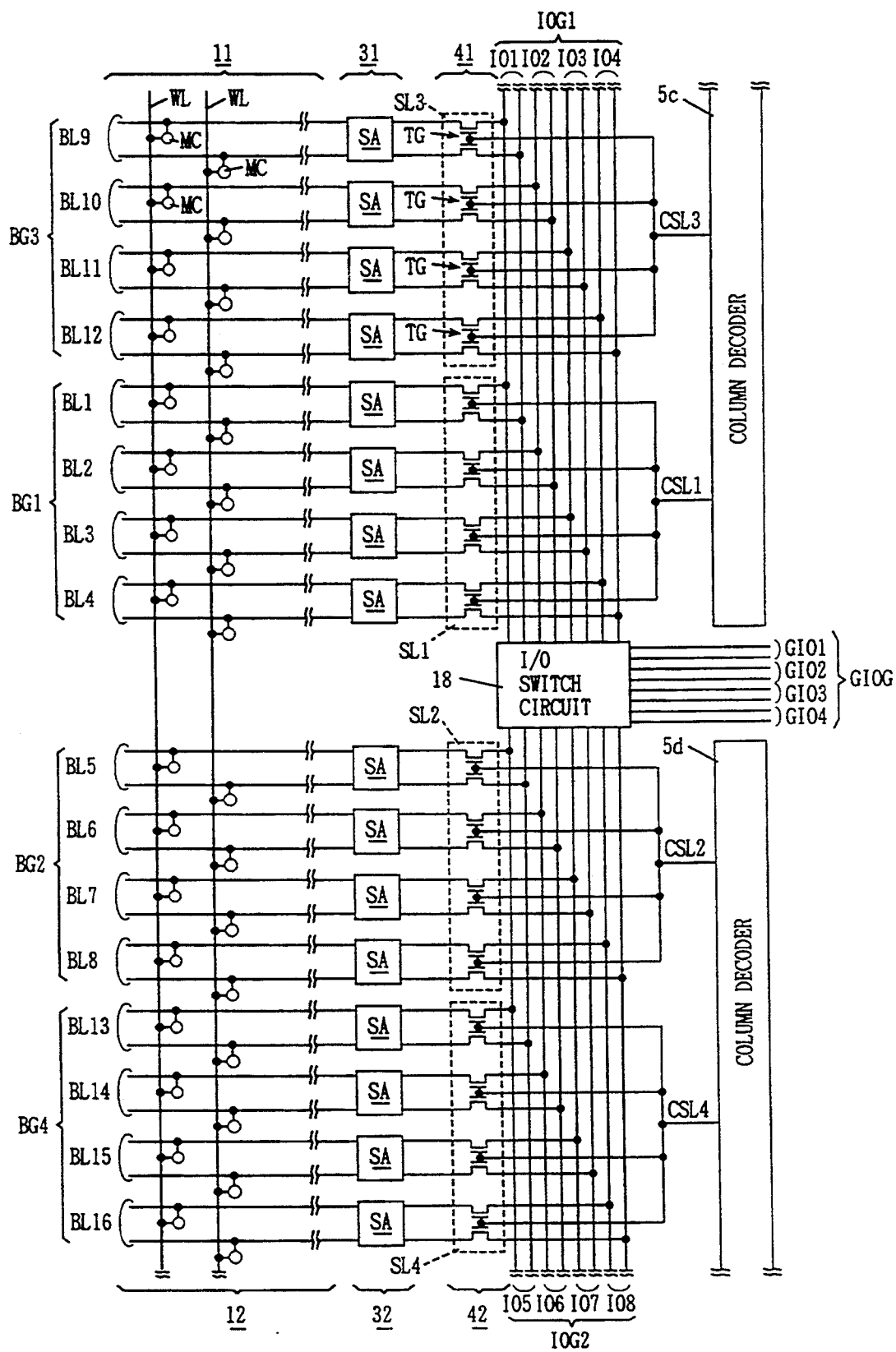
FIG. 23 shows a specific structure of a major part of a DRAM of a third embodiment.

FIG. 23 shows a specific structure of a major part of a DRAM of a third embodiment. The whole structures of the DRAM of the third embodiment are similar to those shown in FIG. 1, except for a layout, as can be seen from FIGS. 23 and 2.

The memory array 1 (see FIG. 1) is divided into first and second memory arrays 11 and 12, as shown in FIG. 23. The first memory array 11 includes a plurality of first bit line groups, and the second memory array 12 includes a plurality of second bit line groups. In FIG. 23, the memory array 11 includes the first bit line groups BG1 and BG3, and the second memory array 12 includes the second bit line groups BG2 and BG4.

The sense amplifier group 3 is divided into first and second sense amplifier groups 31 and 32. The column selecting circuit group 4 is divided into first and second column selecting circuit groups 41 and 42. In FIG. 23, the first column selecting circuit group 41 includes the column selecting circuits SL1 and SL3, and the second column selecting circuit group 42 includes the column selecting circuits SL2 and SL4.

The first input/output line switch IOG1 is disposed adjacently to one end of each of the first bit line groups BG1 and BG3 of the memory array 11, and extends perpendicularly to each bit line pair. The second input/output line group IOG2 is disposed adjacently to one end of each of the second bit line groups BG2 and BG4 of the memory array 12, and extends perpendicularly to each bit line pair.

The input/output line switch circuit 18 is disposed between the first input/output line group IOG1 and the second input/output line group IOG2.

The column decoder 5a is divided into first and second column decoders 5c and 5d. The first column decoder 5c generates a plurality of column selecting signals for selecting a plurality of bit line groups in the first memory array 11. The second column decoder 5d generates a plurality of column selecting signals for selecting a plurality of bit line groups in the second memory array 12.

An operation of this embodiment is similar to that of the DRAM of the first embodiment, except for a difference in signal paths due to the difference in the layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array including a plurality of memory cells arranged in a plurality of rows and a plurality of columns and each storing data; and a plurality of bit lines provided corresponding to said plurality of columns and each connected to memory cells in the corresponding column,
   said plurality of bit lines being divided into a plurality of bit line groups each including a predetermined number of bit lines, said plurality of bit line groups being classified into n main groups;
   n input/output line groups provided corresponding to said n main groups and each including a predetermined number of input/output lines;
   a plurality of connecting means provided corresponding to said plurality of bit line groups and each connected between the corresponding bit line group and the corresponding input/output line group; and
   column selecting means for selectively generating a plurality of selecting signals corresponding to said plurality of connecting means for selecting any of said plurality of bit line groups; wherein
   each of said plurality of connecting means is activated in response to the corresponding selecting signal and connects each bit line in the corresponding bit line group to each input/output line in the corresponding input/output line group; and
   said column selecting means includes means for activating a plurality of connecting means connected to different input/output line groups in said memory array at the same time or with a predetermined time difference.

2. The semiconductor memory device according to claim 1, further comprising:
   a global input/output line group provided commonly to said n input/output line groups and including a predetermined number of input/output lines;
   switching means for selectively connecting each input/output line in said n input/output line groups to the corresponding input/output line in said global input/output line group; and
   input/output line selecting means for sequentially selecting the respective input/output lines in said global input/output line group.

3. The semiconductor- memory device according to claim 2, further comprising:
   address counter means having a first mode for generating an address signal indicative of an address which sequentially changes from an initial address, and a second mode for generating an address signal indicative of an address which circulates within a predetermined range; wherein
   said column selecting means is responsive to a part of said address signal generated from said address counter means to select and activate any ones of said plurality of connecting means at the same time or with a predetermined time difference, and said input/output line selecting means is responsive to the remaining part of said address signal generated from said address counter means to sequentially select data corresponding to said input/output lines in said global input/output line group.

4. The semiconductor memory device according to claim 3, further comprising:

a plurality of word lines provided corresponding to said plurality of rows and each connected to memory cells in the corresponding row;

row selecting means for selecting and activating any one of said plurality of word lines; and control means for activating said address counter means while maintaining a state in which one of said word lines is activated by said row selecting means.

5. The semiconductor memory device according to claim 2, wherein each of said bit lines includes a bit line pair, each of said input/output lines in said n input/output line groups includes an input/output line pair, and each of said input/output lines in said global input/output line group includes an input/output line pair.

6. A semiconductor memory device, comprising:

a memory array including a plurality of memory cells arranged in a plurality of rows and a plurality of columns and each storing data and a plurality of bit lines provided corresponding to said plurality of columns and each connected to memory cells in the corresponding column, said plurality of bit lines being divided into a plurality of bit line groups each including a predetermined number of bit lines;

n input/output line groups each including a predetermined number of input/output lines;

n connecting means groups provided corresponding to said n input/output line groups, each of said n connecting means groups including a plurality of connecting means, provided corresponding to said plurality of bit line groups and each connected between the corresponding bit line group and the corresponding input/output line group; and column selecting means for selectively generating a plurality of selecting signals corresponding to said plurality of connecting means in each connecting means group for selecting any of said plurality of bit line groups, each of said plurality of connecting means in each connecting means group being activated in response to the corresponding selecting signal and connecting each bit line in the corresponding bit line group to each input/output line in the corresponding input/output line group, and said column selecting means including means for activating a plurality of connecting means connected to different input/output line groups in said memory array at the same time or with a predetermined time difference.

7. The semiconductor memory device according to claim 6, further comprising input/output line selecting means for sequentially selecting the respective input/output lines in said n input/output line groups.

8. The semiconductor memory device according to claim 7, further comprising:

address counter means having a first mode for generating an address signal indicative of an address which sequentially changes from an initial address, and a second mode for generating an address signal indicative of an address which circulates within a predetermined range; wherein said column selecting means is responsive to a part of said address signal generated from said address counter means to select and activate any ones of said plurality of connecting means at the same time or with a predetermined time difference, and said input/output line selecting means is responsive to a part of said address signal generated from said address counter means to sequentially select data corresponding to said input/output lines in said n input/output line groups.

9. The semiconductor memory device according to claim 8, further comprising:

a plurality of word lines provided corresponding to said plurality of rows and each connected to memory cells in the corresponding row;

row selecting means for selecting and activating any one of said plurality of word lines; and control means for activating said address counter means while maintaining a state in which one of said word lines is activated by said row selecting means.

10. The semiconductor memory device according to claim 7, wherein each of said bit lines includes a bit line pair, and each of said input/output lines in said n input/output line groups includes an input/output line pair.

11. A semiconductor memory device, comprising:

a memory array including a plurality of memory cells arranged in a plurality of rows and a plurality of columns and each storing data and a plurality of bit lines provided corresponding to said plurality of columns and each connected to memory cells in the corresponding column, said plurality of bit lines being divided into a plurality of bit line groups each including a predetermined number of bit lines, said plurality of bit line groups being classified into n main groups, said bit line groups in said n main groups being disposed alternately;

n input/output line groups provided corresponding to said n main groups and each including a predetermined number of input/output lines;

a plurality of connecting means provided corresponding to said plurality of bit line groups, and each connected between the corresponding bit line group and the corresponding input/output line group;

column selecting means for selectively generating a plurality of selecting signals corresponding to said plurality of connecting means for selecting any of said plurality of bit line groups, each of said plurality of connecting means being activated in response to the corresponding selecting signal and connecting each bit line in the corresponding bit line group to each input/output line in the corresponding input/output line group, said column selecting means including means for activating a plurality of connecting means connected to different input/output line groups in said memory array at the same time or with a predetermined time difference;

a global input/output line group provided commonly to said n input/output line groups and including a predetermined number of input/output lines;

changing means for selectively connecting each input/output line in said n input/output line groups to the corresponding input/output line in said global input/output line group; and input/output line selecting means for sequentially selecting the respective input/output lines in said global input/output line group.

12. A semiconductor memory device comprising:

n memory arrays disposed adjacently to each other, each of said n memory arrays including a plurality of memory cells arranged in a plurality of rows and a plurality of columns and each storing data, and a plurality of bit lines provided corresponding to said plurality of columns and each are connected to memory cells in the corresponding column, and said plurality of bit lines being divided into a plurality of bit line groups, each including a predetermined number of bit lines;

n input/output line groups provided corresponding to said n memory arrays and each including a predetermined number of input/output lines, each located near one end of said plurality of bit line groups in the corresponding memory array and extending perpendicularly to each bit line;

a plurality of connecting means provided corresponding to said plurality of bit line groups in said n memory arrays, and each are connected between the corresponding bit line group and the corresponding input/output line group;

column selecting means for selectively generating a plurality of selecting signals corresponding to said plurality of connecting means for selecting any of said plurality of bit line groups in said n memory arrays;

each of said plurality of connecting means being activated in response to the corresponding selecting signal and connecting each bit line in the corresponding bit line group to each input/output line in the corresponding input/output line group, said column selecting means including means for activating a plurality of connecting means connected to input/output line groups in different memory arrays at the same time or with a predetermined time difference;

a global input/output line group provided commonly to said n input/output line groups and including a predetermined number of input/output lines;

changing means for selectively connecting each input/output line in said n input/output line groups to the corresponding input/output line in said global input/output line group; and input/output line selecting means for sequentially selecting the respective input/output lines in said global input/output line group.

13. A semiconductor memory device, comprising:

a memory array including a plurality of memory cells arranged in a plurality of rows and a plurality of columns and each storing data and a plurality of bit lines provided corresponding to said plurality of columns and each connected to memory cells in the corresponding column, said plurality of bit lines being divided into a plurality of first bit line groups each including a predetermined number of bit lines and a plurality of second bit line groups each including a predetermined number of bit lines;

a first input/output line group including a predetermined number of input/output lines;

a second input/outpour line group including a predetermined number of input/output lines;

a plurality of first connecting means provided corresponding to said plurality of first bit line groups, and each connected between the corresponding first bit line group and said first input/output line group;

a plurality of second connecting means provided corresponding to said plurality of second bit line groups, and each connected between the corresponding second bit line group and said second input/output line group; and column selecting means for selectively generating a plurality of selecting signals corresponding to said plurality of first and second connecting means for selecting any of said plurality of first and second bit line groups;

each of said plurality of first connecting means being activated in response tip the corresponding selecting signal and connecting each bit line in the corresponding first bit line group to each input/output line in said first input/output line group, each of said plurality of second connecting means being activated in response to the corresponding selecting signal to be activated and connecting each bit line in the corresponding second bit line group to each input/output line in said second input/output line group, and said column selecting means including means for activating a plurality of connecting means connected to different input/output line groups in said memory array at the same time or with a predetermined time difference.

14. A semiconductor memory device, comprising:

a memory array including a plurality of memory cells arranged in a plurality of rows and a plurality of columns and each storing data and a plurality of bit lines provided corresponding to said plurality of columns and each connected to memory cells in the corresponding column, said plurality of bit lines being divided into a plurality of bit line groups each including a predetermined number of bit lines;

a first input/output line group including a predetermined number of input/output lines;

a second input/output line group including a predetermined number of input/output lines;

a plurality of first connecting means provided corresponding to said plurality of bit line groups, and each connected between the corresponding bit line group and said first input/output line group;

a plurality of second connecting means provided corresponding to said plurality of bit line groups, and each connected between the corresponding bit line group and the second input/output line group; and column selecting means for selectively generating a plurality of selecting signals corresponding to said plurality of first and second connecting means for selecting any of said plurality of first and second connecting means;

each of said plurality of first connecting means being activated in response to the corresponding selecting signal and connecting each bit line in the corresponding bit line group to each input/output line in said first input/output line group, each of said plurality of second connecting means being activated in response to the corresponding selecting signal and connecting each bit line in the corresponding bit line group to each input/output line in said second input/output line group, and said column selecting means including means for activating a plurality of connecting means connected to different input/output line groups in said memory array at the same time or with a predetermined time difference.

15. An operating method of a semiconductor memory device, including a memory array including a plurality of memory cells arranged in a plurality of rows and a plurality of columns and each store data and a plurality of bit lines provided corresponding to said plurality of columns and each connected to memory cells in the corresponding column, said plurality of bit lines being divided into a plurality of first bit line groups each including a predetermined number of bit lines and a plurality of second bit line groups each including a predetermined number of bit lines; a first input/output line group including a predetermined number of input/output lines; and a second input/output line group including a predetermined number of input/output lines, said method comprising the step of:

connecting any one of said plurality of first bit line groups and any one of said plurality of second bit line groups to said first and second input/output line groups, respectively, at the same time or with a predetermined time difference.

16. The operating method according to claim 15, wherein said semiconductor memory device further includes a global input/output line group including a predetermined number of input/output lines, said method further comprising the steps of:

selectively connecting each input/output line in said first and second input/output line groups to the corresponding input/output line in said global input/output line group; and sequentially selecting the respective input/output lines in said global input/output line group.

17. An operating method of a semiconductor memory device including a memory array including a plurality of memory cells arranged in a plurality of rows and a plurality of columns and each storing data and a plurality of bit lines provided corresponding to said plurality of columns and each connected to memory cells in the corresponding column, said plurality of bit lines being divided into a plurality of bit line groups each including a predetermined number of bit lines, a first input/output line group including a predetermined number of input/output lines, a second input/output line group including a predetermined number of input/output lines, a plurality of first connecting means provided corresponding to said plurality of bit line groups and each connecting the corresponding bit line group to said first input/output line group, and a plurality of second connecting means provided corresponding to said plurality of bit line groups and each connecting the corresponding bit line group to said second input/output line group, said method comprising the step of:

activating any one of said plurality of first connecting means and any one of said plurality of second connecting means at the same time or with a predetermined time difference.

18. The method according to claim 17, further comprising the step of:

sequentially selecting the respective input/output lines in said first and second input/output line groups.

* * * * *